United States Patent
Itoi

(10) Patent No.: US 9,234,946 B2
(45) Date of Patent: Jan. 12, 2016

(54) SEMICONDUCTOR INTEGRATED CIRCUIT, MAGNETIC DETECTING DEVICE, ELECTRONIC COMPASS, AND AMMETER

(71) Applicant: FUJIKURA LTD., Tokyo (JP)

(72) Inventor: Kazuhisa Itoi, Sakura (JP)

(73) Assignee: FUJIKURA LTD., Tokyo (JP)

( * ) Notice: Subject to any disclaimer, the term of this patent is extended or adjusted under 35 U.S.C. 154(b) by 304 days.

(21) Appl. No.: 13/853,812

(22) Filed: Mar. 29, 2013

(65) Prior Publication Data

US 2013/0214777 A1    Aug. 22, 2013

Related U.S. Application Data

(63) Continuation of application No. PCT/JP2011/072419, filed on Sep. 29, 2011.

(30) Foreign Application Priority Data

Sep. 30, 2010  (JP) ................................. 2010-220429

(51) Int. Cl.
| | |
|---|---|
| G01R 33/02 | (2006.01) |
| G01R 33/04 | (2006.01) |
| G01R 33/09 | (2006.01) |
| G01C 17/30 | (2006.01) |

(52) U.S. Cl.
CPC ................ *G01R 33/09* (2013.01); *G01C 17/30* (2013.01); *G01R 33/04* (2013.01)

(58) Field of Classification Search
CPC .................................. G01R 33/04; G01R 33/09
USPC .................................................. 324/252, 253
See application file for complete search history.

(56) References Cited

U.S. PATENT DOCUMENTS

| | | | |
|---|---|---|---|
| 4,267,640 A | 5/1981 | Wu | |
| 4,303,886 A | 12/1981 | Rhodes | |
| 4,918,824 A | 4/1990 | Farrar | |
| 5,187,437 A * | 2/1993 | Rydergren et al. | ........... 324/253 |
| 5,537,038 A | 7/1996 | Ando | |
| 7,391,211 B2 * | 6/2008 | Cripe | ............................ 324/253 |
| 2007/0057669 A1 | 3/2007 | Kobayashi et al. | |
| 2008/0292044 A1 | 11/2008 | Saito et al. | |

FOREIGN PATENT DOCUMENTS

| | | |
|---|---|---|
| CN | 1445556 A | 10/2003 |
| JP | 8-285929 A | 11/1996 |

(Continued)

OTHER PUBLICATIONS

Office Action issued by Taiwanese Patent Office in Taiwanese Application No. 100135516 dated Oct. 22, 2013.

(Continued)

*Primary Examiner* — Renna Aurora
(74) *Attorney, Agent, or Firm* — Sughrue Mion, PLLC

(57) ABSTRACT

A semiconductor integrated circuit includes a clock-signal control circuit controlling intensity-signal output, which is output from a signal processing circuit, to be stopped in at least a forward outage time and a backward outage time. The forward outage time is previous to an apex point of a triangular wave and having 1 to 5% of a triangular wave period. The backward outage time is subsequent to the apex point of the triangular wave and having 1 to 5% of a triangular wave period.

9 Claims, 18 Drawing Sheets

(56) References Cited

FOREIGN PATENT DOCUMENTS

| | | |
|---|---|---|
| JP | 09-152473 A | 6/1997 |
| JP | 2005-147947 A | 6/2005 |
| JP | 2008-292325 A | 12/2008 |
| TW | 200710421 A | 3/2007 |

OTHER PUBLICATIONS

Communication dated Jan. 16, 2015 from the European Patent Office in counterpart European Application No. 11829291.1.

* cited by examiner

STOP OF SIGNAL

BLOCK SIGNAL

SEMICONDUCTOR INTEGRATED CIRCUIT, MAGNETIC DETECTING DEVICE, ELECTRONIC COMPASS, AND AMMETER

CROSS REFERENCE TO RELATED APPLICATIONS

This application is a continuation application based on a PCT Patent Application No. PCT/JP2011/072419, filed Sep. 29, 2011, whose priority is claimed on Japanese Patent Application No. 2010-220429 filed on Sep. 30, 2010, the entire content of which are hereby incorporated by reference.

BACKGROUND OF THE INVENTION

1. Field of the Invention

The present invention relates to a semiconductor integrated circuit, a magnetic detecting device, an electronic compass, and an ammeter, particularly, technique suitably used for a flux-gate magnetic sensor.

2. Description of the Related Art

As a magnetic field detection sensor, a flux-gate magnetic sensor is used which utilizes the shift of the B-H characteristics of a magnetic core having high magnetic permeability, which is caused by an input magnetic field, and the flux-gate magnetic sensor has resolution capability greater than a magnetic sensor using a hall device, a magnetoresistance element, or the like, and has the characteristics excellent in temperature stability.

The flux-gate magnetic sensor receives an external magnetic field such as geomagnetism or the like as an input magnetic field and is provided with a magnetic-field detection unit detecting the magnitude of the input magnetic field.

As such magnetic-field detection unit, a magnetic-field detection unit is known which is constituted of, an example, a magnetic core, an excitation coil which is wound around the magnetic core and excites the magnetic core, and a detecting coil (pick-up coil) which is wound around the magnetic core and detects the induced voltage depending on magnetic variation inside the magnetic core (refer to Japanese Unexamined Patent Application, First Publication No. 2005-147947, Japanese Unexamined Patent Application, First Publication No. H09-152473, and G. Trenkler: "Die Messung schwacher magnetischer Felder mittels Magnetometer mit direkter Zeitverschlusselung", Messtechnik, 205, (1970)).

In the foregoing flux-gate magnetic sensor, a method is proposed which supplies a triangular wave current with the excitation coil, and measures, by a counter, the time interval in which a spike-shaped voltage waveform (pickup waveform) is generated when the magnetic flux in the magnetic core is reversed at the time of supplying the current.

Since the spike-shaped voltage waveform shifts on the time axis depending on the presence or absence of the intensity of the measured magnetic field (external magnetic field) of the environment in which a sensor is disposed, it is possible to detect the measured magnetic field by use of the time interval at which the waveform is detected.

The above-described method excites the core of the magnetic body by applying the excitation current having a triangular wave, when the phase applying the maximum value of the output voltage appearing in the pick-up coil is varied depending on the measured magnetic field, detects the phase difference (time difference) of the varied positive and negative peak voltages, and converts it into the values of the measured magnetic field.

Furthermore, phase detection is started in synchronization with the point at which the absolute value of the excitation triangular wave becomes maximum, that is, for example, the excitation waveform reaches the peak point.

However, in the voltage appearing in the pick-up coil, the variation of temporal differentiation in density of magnetic flux in the core of a magnetic body is detected. Therefore, at the region close to the position at which the absolute value of the excitation triangular wave is the maximum value and the variation of temporal differentiation is low in the excitation triangular wave, the absolute value of the pickup voltage decreases.

Consequently, regarding variation in the phase difference with respect to the measured magnetic field, the linearity of sensor output deteriorates at the region close to the position at which the absolute value of the excitation triangular wave becomes maximum.

Particularly, in the case where the operating time of the counter is represented by a dynamic range, sensor output linearity at both ends of the dynamic range deteriorates in accordance with deterioration in linearity at the region close to the position at which the absolute value of the excitation triangular wave becomes maximum.

SUMMARY OF THE INVENTION

The present invention has an object to provide a semiconductor integrated circuit which maintains output linearity at all over dynamic range and is capable of operating a flux-gate magnetic detecting device having excellent output characteristics, the flux-gate magnetic detecting device, an electronic compass, and an ammeter.

A semiconductor integrated circuit of a first aspect of the invention includes: a clock-signal generation circuit; a signal processing circuit outputting an intensity signal corresponding to an intensity of an external magnetic field based on a time interval between a first spike-shaped voltage waveform and a second spike-shaped voltage waveform in accordance with a clock signal output from the clock-signal generation circuit, the second spike-shaped voltage waveform being detected subsequent to the first spike-shaped voltage waveform, the second spike-shaped voltage waveform having an inverse sign to that of the first spike voltage waveform; and a clock-signal control circuit controlling intensity-signal output, which is output from the signal processing circuit, to be stopped at at least a forward outage time and a backward outage time, the forward outage time being previous to an apex point of a triangular wave and having 1 to 5% of a triangular wave period, the backward outage time being subsequent to the apex point of the triangular wave and having 1 to 5% of a triangular wave period.

In the semiconductor integrated circuit of the first aspect of the invention, it is preferable that the semiconductor integrated circuit be used for a flux-gate magnetic sensor having a magnetic core, an excitation unit varying magnetic flux of the magnetic core, and a detecting coil detecting the magnetic flux of the magnetic core, and the magnetic sensor provide a triangular wave current to the excitation unit as an excitation current, detect the first spike-shaped voltage waveform having a positive sign output from the detecting coil and the second spike-shaped voltage waveform having a negative sign, measure the time interval between the first spike-shaped voltage waveform and the second spike-shaped voltage waveform, and detect an intensity of an external magnetic field based on the time interval.

In the semiconductor integrated circuit of the first aspect of the invention, it is preferable that an intensity signal of an external magnetic field at time excluding the forward outage time and the backward stop be output as a dynamic range.

A magnetic detecting device of a second aspect of the invention includes: a flux-gate magnetic sensor unit including: a magnetic core; a detecting coil detecting variations in magnetic flux in the magnetic core; an excitation unit varying magnetic flux in the magnetic core in accordance with a periodic excitation current to be supplied; and a detection unit detecting induced output generated from the detecting coil in accordance with variations in magnetic flux in the magnetic core due to the excitation unit, the flux-gate magnetic sensor unit providing a triangular wave current to the excitation unit as an excitation current, the flux-gate magnetic sensor unit detecting spike-shaped voltage waveforms having a positive sign and a negative sign output from the detecting coil, the flux-gate magnetic sensor unit measuring a time interval between a first spike-shaped voltage waveform and a second spike-shaped voltage waveform, the second spike-shaped voltage waveform being detected subsequent to the first spike-shaped voltage waveform, the second spike-shaped voltage waveform having an inverse sign to that of the first spike voltage waveform, the flux-gate magnetic sensor unit detecting an intensity of an external magnetic field based on the time interval; and a semiconductor integrated circuit including: a clock-signal generation circuit; a signal processing circuit outputting an intensity signal corresponding to an intensity of an external magnetic field based on a time interval between the induced outputs which are detected by the detection unit and which have signs different from each other in accordance with a clock signal output from the clock-signal generation circuit; and a clock-signal control circuit controlling intensity-signal output, which is output from the signal processing circuit, to be stopped in at least a forward outage time and a backward outage time, the forward outage time being previous to an apex point of a triangular wave and having 1 to 5% of a triangular wave period, the backward outage time being subsequent to the apex point of the triangular wave and having 1 to 5% of a triangular wave period.

The magnetic detecting device of the second aspect of the invention, it is preferable that an intensity signal of an external magnetic field at time excluding the forward outage time and the backward stop be output as a dynamic range in the semiconductor integrated circuit.

A electronic compass of a third aspect of the invention includes: a substrate; a first flux-gate magnetic sensor unit, a second flux-gate magnetic sensor unit, and a third flux-gate magnetic sensor unit disposed on the substrate and arranged along three axes; and a semiconductor integrated circuit.

In the electronic compass of the third aspect of the invention, each of a first magnetic sensor unit, a second magnetic sensor unit, and a third magnetic sensor unit includes: a magnetic core; a detecting coil detecting variations in magnetic flux in the magnetic core; an excitation unit varying magnetic flux in the magnetic core in accordance with a periodic excitation current to be supplied; and a detection unit detecting induced output generated from the detecting coil in accordance with variations in magnetic flux in the magnetic core due to the excitation unit, and each of the first magnetic sensor unit, the second magnetic sensor unit, and the third magnetic sensor unit provides a triangular wave current to the excitation unit as an excitation current, detects spike-shaped voltage waveforms having a positive sign and a negative sign output from the detecting coil, measures a time interval between a first spike-shaped voltage waveform and a second spike-shaped voltage waveform, detects an intensity of an external magnetic field based on the time interval, the second spike-shaped voltage waveform is detected subsequent to the first spike-shaped voltage waveform, the second spike-shaped voltage waveform has an inverse sign to that of the first spike voltage waveform.

In the electronic compass of the third aspect of the invention, the semiconductor integrated circuit includes: a clock-signal generation circuit; a signal processing circuit outputting an intensity signal corresponding to an intensity of an external magnetic field based on a time interval between the induced outputs which are detected by the detection unit and which have signs different from each other in accordance with a clock signal output from the clock-signal generation circuit; and a clock-signal control circuit controlling intensity-signal output, which is output from the signal processing circuit, to be stopped in at least a forward outage time and a backward outage time, the forward outage time is previous to an apex point of a triangular wave and having 1 to 5% of a triangular wave period, the backward outage time is subsequent to the apex point of the triangular wave and having 1 to 5% of a triangular wave period.

In the electronic compass of the third aspect of the invention, it is preferable that an intensity signal of an external magnetic field at time excluding the forward outage time and the backward stop be output as a dynamic range in the semiconductor integrated circuit.

An ammeter of a fourth aspect of the invention includes: a substrate; a first flux-gate magnetic sensor unit, a second flux-gate magnetic sensor unit, and a third flux-gate magnetic sensor unit disposed on the substrate and arranged along three axes; and a semiconductor integrated circuit.

In the ammeter of the fourth aspect of the invention, each of a first magnetic sensor unit, a second magnetic sensor unit, and a third magnetic sensor unit includes: a magnetic core; a detecting coil detecting variations in magnetic flux in the magnetic core; an excitation unit varying magnetic flux in the magnetic core in accordance with a periodic excitation current to be supplied; and a detection unit detecting induced output generated from the detecting coil in accordance with variations in magnetic flux in the magnetic core due to the excitation unit, and each of the first magnetic sensor unit, the second magnetic sensor unit, and the third magnetic sensor unit provides a triangular wave current to the excitation unit as an excitation current, detects spike-shaped voltage waveforms having a positive sign and a negative sign output from the detecting coil, measures a time interval between a first spike-shaped voltage waveform and a second spike-shaped voltage waveform, detects an intensity of an external magnetic field based on the time interval, the second spike-shaped voltage waveform is detected subsequent to the first spike-shaped voltage waveform, the second spike-shaped voltage waveform has an inverse sign to that of the first spike voltage waveform.

In the ammeter of the fourth aspect of the invention, the semiconductor integrated circuit includes: a clock-signal generation circuit; a signal processing circuit outputting an intensity signal corresponding to an intensity of an external magnetic field based on a time interval between the induced outputs which are detected by the detection unit and which have signs different from each other in accordance with a clock signal output from the clock-signal generation circuit; and a clock-signal control circuit controlling intensity-signal output, which is output from the signal processing circuit, to be stopped in at least a forward outage time and a backward outage time, the forward outage time is previous to an apex point of a triangular wave and having 1 to 5% of a triangular wave period, the backward outage time is subsequent to the apex point of the triangular wave and having 1 to 5% of a triangular wave period.

In the ammeter of the fourth aspect of the invention, it is preferable that an intensity signal of an external magnetic field at time excluding the forward outage time and the backward stop be output as a dynamic range in the semiconductor integrated circuit.

EFFECTS OF THE INVENTION

According to the invention, it is possible to obtain an effect that deterioration in the linearity of the output can be prevented by stopping the output of the intensity of the external magnetic field at the stop period, that is, at the region in which the signal intensity becomes low and which is close to the apex point of the triangular wave.

DESCRIPTION OF THE PREFERRED EMBODIMENTS

Hereinafter, a magnetic detecting device, which is constituted of a magnetic sensor unit and a semiconductor integrated circuit, of a first embodiment related to the invention will be described with reference to drawings.

Figure 1:
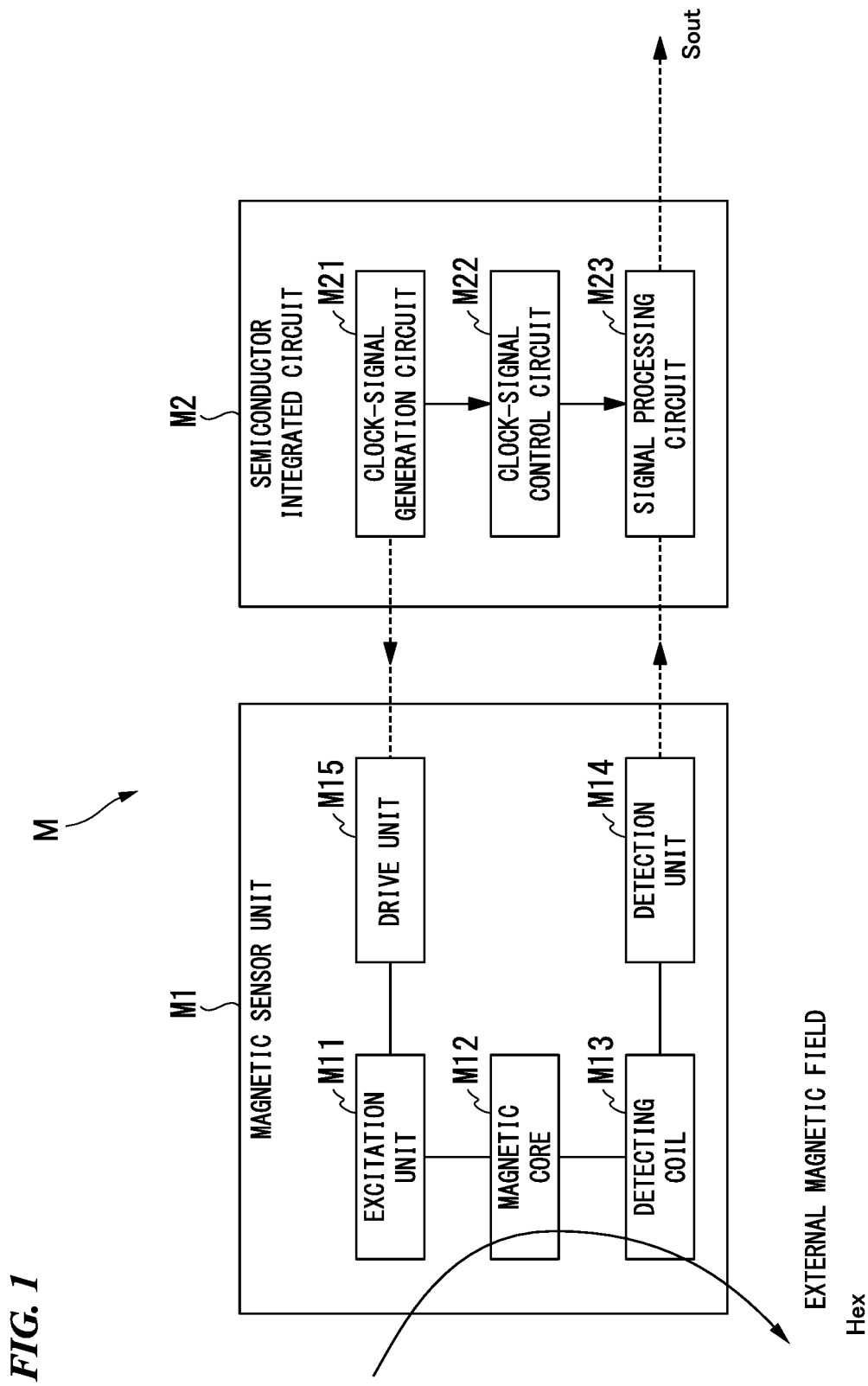
FIG. 1 is a schematic view illustrating a semiconductor integrated circuit and a magnetic detecting device of a first embodiment related to the invention.

FIG. 1 is a schematic view showing functional elements of a magnetic detecting device which is constituted of a magnetic sensor unit and a semiconductor integrated circuit of the embodiment, and the relationships among the functional elements. Reference letter M represents a magnetic detecting device in the drawing.

As shown in FIG. 1, a magnetic detecting device M of the embodiment is provided with a flux-gate magnetic sensor unit M1 and a semiconductor integrated circuit M2.

In FIG. 1, a solid line connecting the functional elements to each other represents electrically connection, a dotted line represents electromagnetically connection, and the arrow represents the direction of an electrical signal.

The magnetic sensor unit M1 and the semiconductor integrated circuit M2 have an excitation unit M11, a magnetic core M12 (core of a magnetic body), a detecting coil M13, a detection unit M14, a drive unit M15, a clock-signal generation circuit M21, a clock-signal control circuit M22, and a signal processing circuit M23.

The detecting coil M13 detects variations in the magnetic flux in the magnetic core M12.

The excitation unit M11 varies the magnetic flux in the magnetic core in accordance with a periodic excitation current to be supplied.

The detection unit M14 detects the induced output generated from the detecting coil M13 in accordance with variations in the magnetic flux in the magnetic core M12 due to the excitation unit M11.

The signal processing circuit M23 calculates and outputs the intensity signal corresponding to the intensity of the external magnetic field based on the time interval between induced outputs having different signs which are detected by the detection unit M14 in accordance with a clock signal output from the clock-signal generation circuit M21.

The clock-signal control circuit M22 controls and outputs a stop signal allowing the intensity-signal output Sout, which is output from the signal processing circuit M23, to be stopped.

Specifically, the clock-signal control circuit M22 controls the aforementioned stop signal to be output at, at least the forward outage time tA, which represents the specified percentage (%) to a triangular wave period and which is previous to the apex point of the triangular wave, and the backward outage time tB, which becomes the length of time representing the specified percentage (%) to a triangular wave period and which is subsequent to the apex point of the triangular wave.

As a constitution of excitation unit, a structure may be adopted which includes the excitation unit M11, which is provided at the position close to the magnetic core M12 and which functions as an excitation coil, and the drive unit M15 controlling an excitation state of the excitation unit by supplying an excitation current to the excitation unit M11.

Furthermore, as a constitution of excitation unit, a constitution may be adopted which functions as the magnetic core M12 and excites the position close to the magnetic core M12 and the detecting coil M13 by applying an excitation current.

The constitution of the excitation unit is not limited to the foregoing constitution, as long as the necessary excitation can be carried out.

The drive unit M15 provides a triangular wave current to the excitation unit with respect to the magnetic core M12 as an excitation current and detects each of spike-shaped voltage waveforms which have a positive sign or a negative sign and which are output from the detecting coil M13 provided to the magnetic core M12.

The magnetic sensor unit M1 measures the time interval between one spike-shaped voltage waveform (first spike-shaped voltage waveform) and a subsequent spike-shaped voltage waveform that is subsequently detected and has an inverse sign (second spike-shaped voltage waveform), and detects the intensity of the external magnetic field based on the time interval.

The semiconductor integrated circuit M2 has the clock-signal generation circuit M21, the detection unit M14, the drive unit M15, the signal processing circuit M23, and the clock-signal control circuit M22.

The semiconductor integrated circuit M2 is configured to output the output signal Sout based on data which is obtained from the magnetic sensor unit M1 in the case where the stop signal is turned off.

As described below, in accordance with the stop signal, which is output from the clock-signal control circuit M22, the control of stopping the operation of intensity signal calculation corresponding to the intensity of the external magnetic field in the signal processing circuit M23 is carried out in the outage time tA and the outage time tB based on the clock signal of the clock-signal generation circuit M21, or the operation of the intensity signal calculation in the signal processing circuit M23 is carried out while controlling the output thereof to be stopped.

Particularly, the outage time tA and the outage time tB will be described later.

Next, operation of the magnetic detecting device M of the embodiment having the aforementioned constitution and a method for detecting the intensity of the external magnetic field based on the time interval between the detected induced outputs having different signs (magnetic field detection method) will be described.

Here, the case of providing a triangular wave current to the excitation unit M11 serving as an excitation unit will be illustrated as an example.

Firstly, a detection time at which measurement and detection of an external magnetic field are carried out is started, continuous clock signals are generated from the clock-signal generation circuit M21 of the semiconductor integrated circuit M2; furthermore, an alternating-current source is turned on in the drive unit M15 supplying an alternating current for exciting the excitation unit M11 based on the clock signals.

Figure 2A:
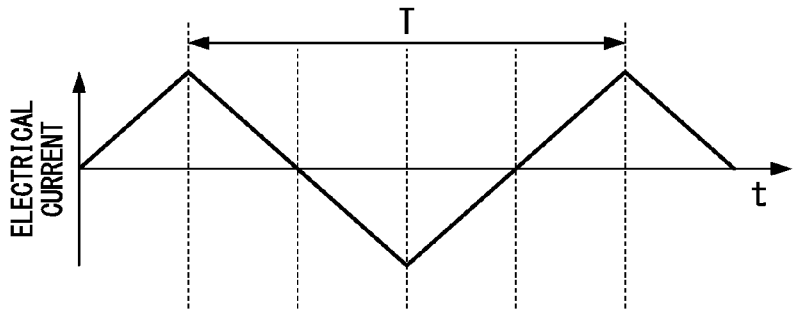
FIG. 2A is a chart illustrating a method for detecting a magnetic field in the semiconductor integrated circuit and the magnetic detecting device of the first embodiment related to the invention and is graph illustrating an example of a triangular wave current.

Here, as an electrical current pattern which is supplied by the alternating-current source, an example of an electrical current having a polarity reversion triangular waveform having a period T is shown in FIG. 2A.

The magnetic core M12 is excited by the triangular wave current supplied from the drive unit M15.

Figure 2B:
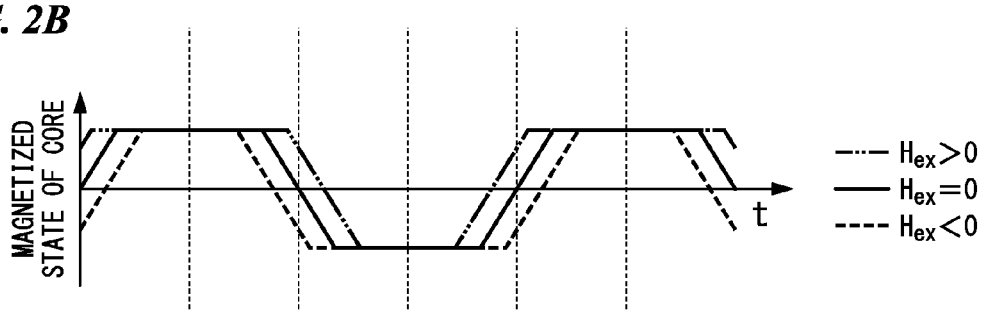
FIG. 2B is a chart illustrating a method for detecting a magnetic field in the semiconductor integrated circuit and the magnetic detecting device of the first embodiment related to the invention and is graph illustrating variation in a magnetized state in a magnetic core.
Figure 2C:
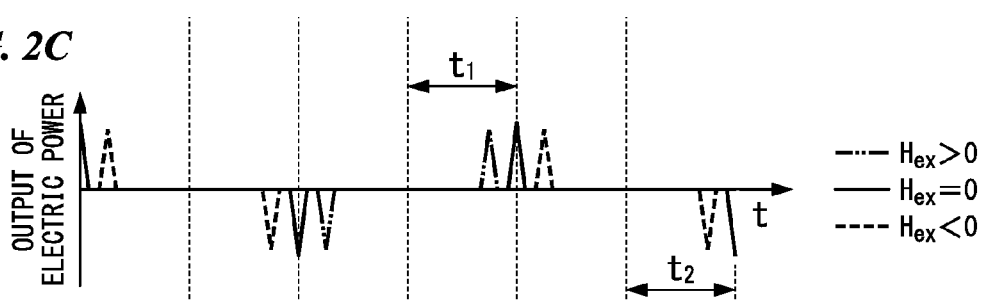
FIG. 2C is a chart illustrating a method for detecting a magnetic field in the semiconductor integrated circuit and the magnetic detecting device of the first embodiment related to the invention and is graph illustrating the resultant spike-shaped voltage.
Figure 2D:
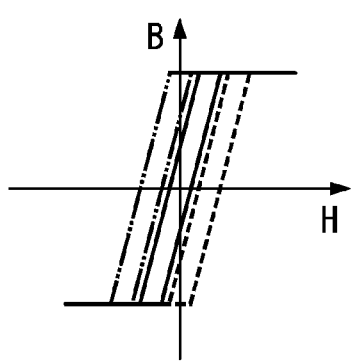
FIG. 2D is a chart illustrating a method for detecting a magnetic field in the semiconductor integrated circuit and the magnetic detecting device of the first embodiment related to the invention and is graph illustrating a magnetic hysteresis curve.

As shown in FIG. 2D, the magnetic flux following the B-H curve is generated in the magnetic core M12.

FIG. 2B shows a temporal variation in the magnetized state (density of magnetic flux) in the magnetic core M12 formed of a soft magnetic material.

As shown in FIG. 2B, the magnetic flux in the longitudinal direction with the direction thereof being varied is alternately generated in the magnetic core M12.

Here, the solid line indicated in FIG. 2B shows a temporal variation in the magnetized state of the magnetic core M12 in the case where the magnetic sensor unit M1 is subjected to the environment in which an external magnetic field is not substantially present (Hex=0).

The chain double-dashed line indicated in FIG. 2B shows a temporal variation in the magnetized state of the magnetic core M12 in the case where the magnetic sensor unit M1 is subjected to an external magnetic field having a positive direction (Hex>0).

The dotted line indicated in FIG. 2B shows a temporal variation in the magnetized state of the magnetic core M12 in the case where the magnetic sensor unit M1 is subjected to an external magnetic field having a negative direction (Hex<0).

The magnetic flux generated in the magnetic core M12 intersects with the detecting coil M13 and generates an induced voltage (induced current).

Consequently, the induced voltage generated from the detecting coil M13 is output to the detection unit M14 from an output terminal of the detecting coil M13 as an output voltage.

At this time, as shown in FIG. 2C, as the output voltage waveform which is detected from each output terminal, inverse spike-shaped voltage waveforms to each other (spike waves) are output.

The inverse voltage waveforms to each other are output at the timings at which the direction of the magnetic flux generated from the magnetic core M12 reverses from the positive direction to the negative direction and reverses from the negative direction to the positive direction.

The detection unit M14 in the semiconductor integrated circuit M2 outputs the spike waves to the signal processing circuit M23 so as to amplify the waves and to be able to count them.

Here, The solid line indicated in FIG. 2C shows an output voltage waveform in the case where the magnetic sensor unit M1 is subjected to the environment in which an external magnetic field is not substantially present (Hex=0).

The chain double-dashed line indicated in FIG. 2C shows an output voltage waveform in the case where the magnetic sensor unit M1 is subjected to an external magnetic field having a positive direction (Hex>0).

The dotted line indicated in FIG. 2C shows an output voltage waveform in the case where the magnetic sensor unit M1 is subjected to an external magnetic field having a negative direction (Hex<0).

As compared with the case where the external magnetic field is not substantially present, the position of the spike-shaped voltage waveform shifts to the right side or the left side on the time axis in the drawing in the external magnetic field as described above depending on the direction and the intensity of the external magnetic field.

Regarding the output voltage waveforms, it is possible to calculate the intensity of the external magnetic field by measuring the time interval between one spike-shaped voltage waveform and a subsequent spike-shaped voltage waveform that is subsequently detected and has an inverse sign, and carrying out a predetermined calculation by use of Equations (1) to (3) based on the time interval.

In the Equations (1) to (3), $t_1$ represents the time at which a positive induced voltage is generated, and $t_2$ represents the time at which a negative induced voltage is generated.

Hexc represents an excitation magnetic field (magnetic field generated at the excitation unit).

Hc represents a coersive force of the magnetic core, Hext represents an external magnetic field, and Td represents delay time.

(Formula 1)
$$t_1 = \left[\frac{Hexc + Hc - Hext}{Hexc}\right] \cdot \frac{T}{4} + Td \quad \text{Equation (1)}$$

(Formula 2)
$$t_2 = \left[\frac{Hexc + Hc + Hext}{Hexc}\right] \cdot \frac{T}{4} + Td \quad \text{Equation (2)}$$

(Formula 3)
$$t_2 - t_1 = \frac{Hext}{Hexc} \cdot \frac{T}{2} \quad \text{Equation (3)}$$

In the semiconductor integrated circuit M2, the clock signals are output to the drive unit M15 so that the triangular wave current having the period T shown in FIG. 2A is provided so as to reach peak points at time $t_1$, time $t_3$, time $t_5$, and time $t_7$.

Figure 3A:
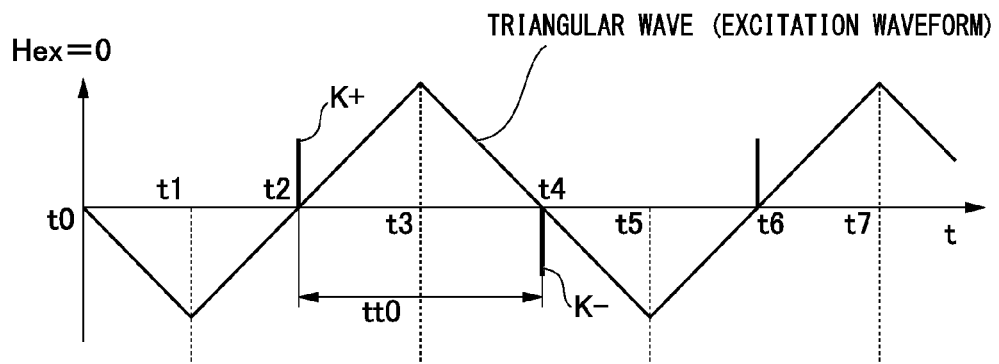
FIG. 3A is a chart illustrating the relationships among an excitation waveform, a spike-shaped voltage waveform, and a time interval in the semiconductor integrated circuit and the magnetic detecting device of the first embodiment related to the invention, and illustrates the case where an external magnetic field is absent.

Additionally, in the case where the external magnetic field is not present (Hex=0), a spike-shaped voltage waveform K+ having the positive sign is detected at time $t_2$ and time $t_6$ at which the polarity of the triangular wave inverts from negative to positive as shown in FIG. 3A.

Furthermore, at time $t_4$ at which the polarity of the triangular wave inverts from positive to negative, a spike-shaped voltage waveform K– having the negative sign is detected.

Such voltage waveform K+ and voltage waveform K– are input from the magnetic sensor unit M1 to the signal processing circuit M23.

At this time, the time interval $tt_0$ between the spike-shaped voltage waveform K+ having the positive sign and the spike-shaped voltage waveform K– having the negative sign is the reference time interval at the external magnetic field Hex=0.

Figure 3B:
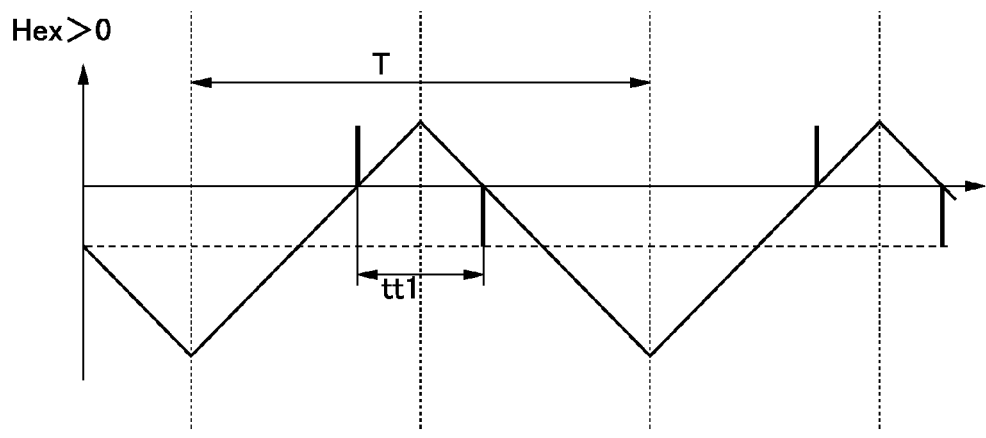
FIG. 3B is a chart illustrating the relationships among an excitation waveform, a spike-shaped voltage waveform, and a time interval in the semiconductor integrated circuit and the magnetic detecting device of the first embodiment related to the invention, and illustrates the case where a positive external magnetic field is present.

In the case where the external magnetic field having the positive sign is present (Hex>0), similarly, the triangular wave current reaches the peak points at time $t_1$, time $t_3$, time $t_5$, and time $t_7$ as shown in FIG. 3B.

The times, at which the polarity of the triangular wave is reversed, are different from each other (shift) due to the presence of the external magnetic field, therefore, the magnitude of the positive external magnetic field is calculated in the signal processing circuit M23 by comparing the reference time interval $tt_0$ with the time interval $tt_1$ between the spike-shaped voltage waveform K+ having the positive sign shorter than the time interval $tt_0$ and the spike-shaped voltage waveform K– having the negative sign.

Here, in the case where the time, at which the polarity thereof reversed, is displaced from time $t_2$ and time $t_6$ and is close to $t_1$, $t_3$, and $t_5$ due to the presence of the positive external magnetic field, the absolute value (signal intensity) of the spike-shaped voltage waveform becomes low.

Figure 3C:
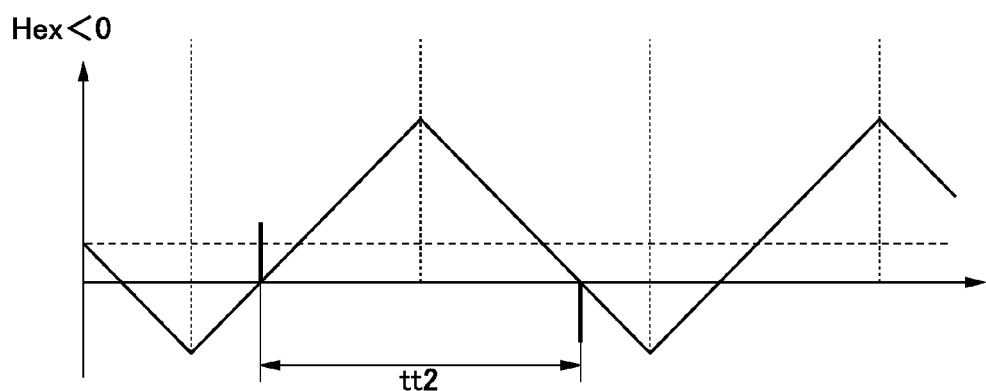
FIG. 3C is a chart illustrating the relationships among an excitation waveform, a spike-shaped voltage waveform, and a time interval in the semiconductor integrated circuit and the magnetic detecting device of the first embodiment related to the invention, and illustrates the case where a negative external magnetic field is present.

In the case where the external magnetic field having the negative sign is present (Hex<0), similarly, the triangular wave current reaches the peak points at time $t_1$, time $t_3$, time $t_5$, and time $t_7$ as shown in FIG. 3C.

The times, at which the polarity of the triangular wave is reversed, are different from each other due to the presence of the external magnetic field, therefore, the magnitude of the negative external magnetic field is calculated in the signal processing circuit M23 by comparing the reference time interval $tt_0$ with the time interval $tt_2$ between the spike-shaped voltage waveform K+ having the positive sign longer than the time interval $tt_0$ and the spike-shaped voltage waveform K– having the negative sign.

Similarly, in the case where the time, at which the polarity thereof reversed, is displaced from time $t_2$ and time $t_6$ and is close to $t_1$, $t_3$, and $t_5$ due to the presence of the negative external magnetic field, the absolute value (signal intensity) of the spike-shaped voltage waveform becomes low.

As mentioned above, the absolute value of the spike-shaped voltage waveform decreases at the time of approaching the peak points of the triangular wave current such as at $t_1$, $t_3$, and $t_5$.

Figure 4A:
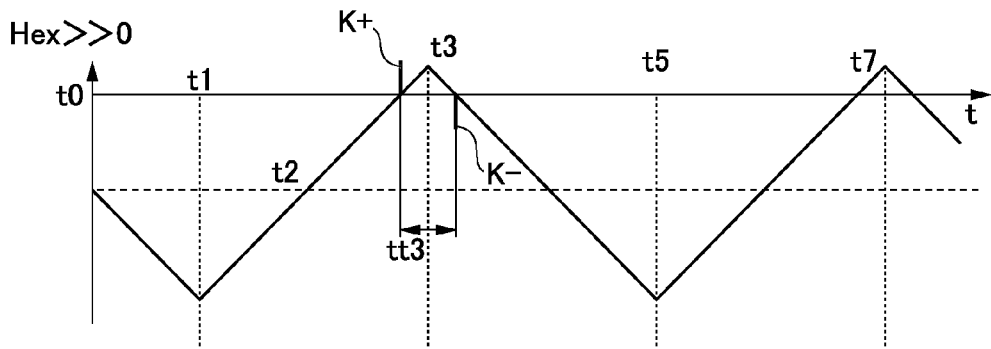
FIG. 4A is a chart illustrating the relationships among an excitation waveform, a spike-shaped voltage waveform, and a time interval in the semiconductor integrated circuit and the magnetic detecting device of the first embodiment related to the invention, and illustrates the case where a great amount of positive external magnetic field is present.

As shown in FIG. 4A, for example, in the case where a high external magnetic field having the positive sign is present (Hex>>0) as shown in FIG. 3B and where the time at which the spike-shaped voltage waveform is generated approaches time $t_3$ or time $t_7$ of the apex point of the triangular wave, the time interval $tt_3$ between the spike-shaped voltage waveform K+ having the positive sign and the spike-shaped voltage waveform K– having the negative sign is even shorter than the time interval $tt_1$ and the magnitudes of the absolute values of the spike-shaped voltage waveforms K+ and K– (signal intensities) decrease.

Figure 4B:
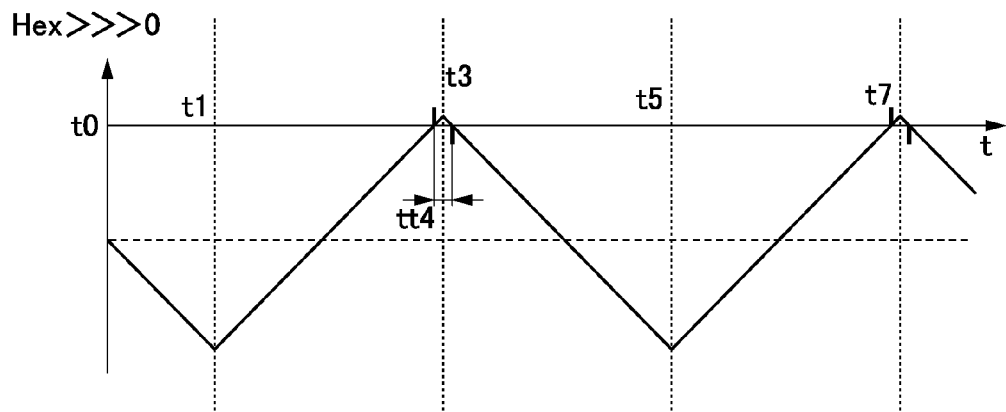
FIG. 4B is a chart illustrating the relationships among an excitation waveform, a spike-shaped voltage waveform, and a time interval in the semiconductor integrated circuit and the magnetic detecting device of the first embodiment related to the invention, and illustrates the case where a further great amount of positive external magnetic field is present.

Additionally, as shown in FIG. 4B, in the case where a higher external magnetic field having the positive sign is present (Hex>>>0) as shown in FIG. 4A and where the time at which the spike-shaped voltage waveform is generated more approaches time $t_3$ or time $t_7$ of the apex point of the triangular wave, the time interval $tt_4$ between the spike-shaped voltage waveform K+ having the positive sign and the spike-shaped voltage waveform K– having the negative sign is even shorter than the time interval $tt_3$ and the magnitudes of the absolute values of the spike-shaped voltage waveforms K+ and K– (signal intensities) also decrease.

Figure 4C:
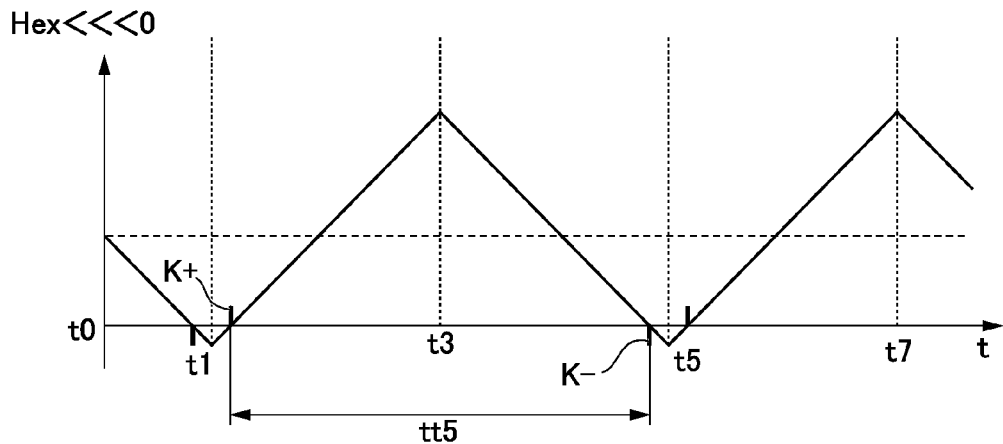
FIG. 4C is a chart illustrating the relationships among an excitation waveform, a spike-shaped voltage waveform, and a time interval in the semiconductor integrated circuit and the magnetic detecting device of the first embodiment related to the invention, and illustrates the case where a great amount of negative external magnetic field is present.

Similarly, as shown in FIG. 4C, in the case where the negative external magnetic field having the magnitude of the absolute value which is substantially the same degree as the magnetic field shown in FIG. 4B is present (Hex<<<0) and where the time at which the spike-shaped voltage waveform is generated approaches time $t_1$ or time $t_5$ of the apex point of the triangular wave, the time interval $tt_5$ between the spike-shaped voltage waveform K+ having the positive sign and the spike-shaped voltage waveform K– having the negative sign becomes short similarly to the time interval $tt_4$ and the magnitudes of the absolute values of the spike-shaped voltage waveforms K+ and K– (signal intensities) also decrease in the same range.

As described above, when the intensity of the external magnetic field is calculated, output accuracy is maintained without using the spike-shaped voltage waveforms K+ and K–, in which the magnitudes (intensities) of the absolute values thereof decrease.

For this purpose, in the semiconductor integrated circuit M2, the clock-signal control circuit M22 outputs the stop signal which turns on the control of stopping the intensity-signal output Sout output from the signal processing circuit M23 before or after time $t_1$, time $t_3$, time $t_5$, and time $t_7$ close to the apex points of the triangular wave in accordance with the clock signal output from the clock-signal generation circuit M21.

Figure 5A:
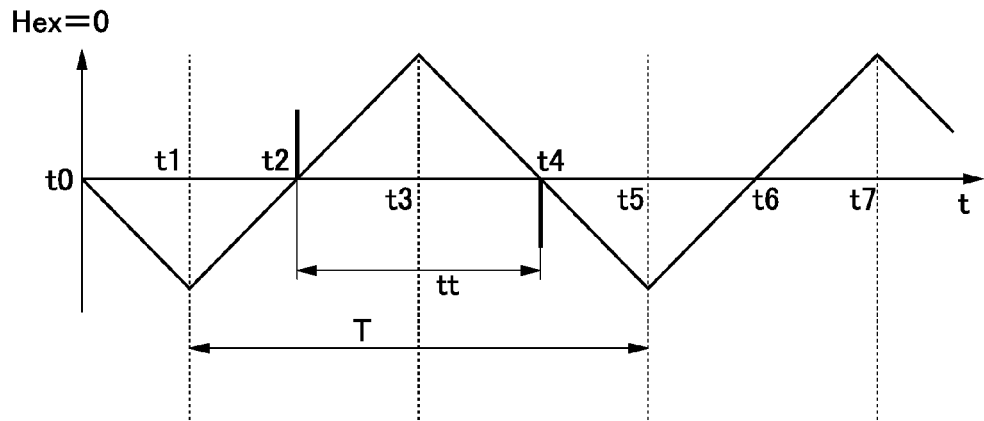
FIG. 5A is a chart illustrating operation of the semiconductor integrated circuit and the magnetic detecting device of the first embodiment related to the invention and is a graph illustrating the relationship between an excitation waveform and a spike-shaped voltage waveform.
Figure 5B:
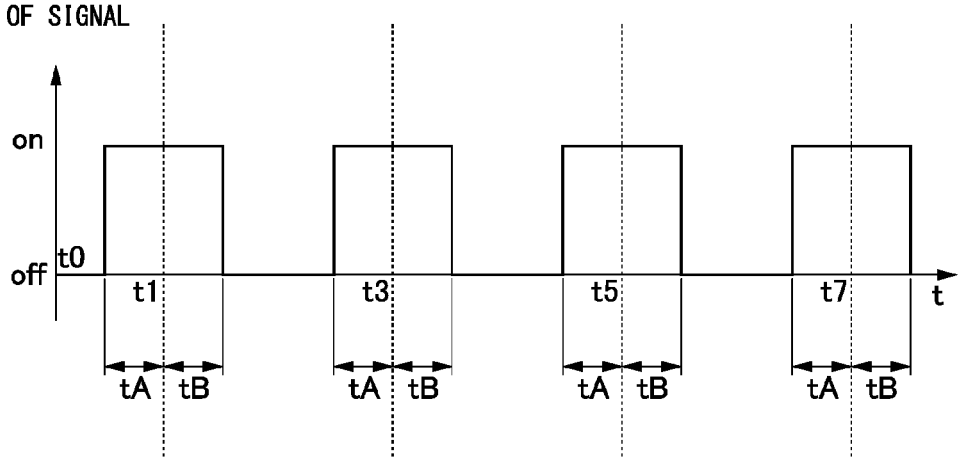
FIG. 5B is a chart illustrating operation of the semiconductor integrated circuit and the magnetic detecting device of the first embodiment related to the invention and illustrates output of a stop signal by a clock-signal control circuit.

As shown in FIG. 5B, the stop signal is output between the forward outage time tA previous to time $t_1$, time $t_3$, time $t_5$, and time $t_7$ at which the triangular wave reaches the apex points and which corresponds to 0.1 to 5% of the period T, and, the backward outage time tB subsequent to time $t_1$, time $t_3$, time $t_5$, and time $t_7$ at which the triangular wave reaches the apex points and which corresponds to 0.1 to 5% of the period T.

Figure 5C:
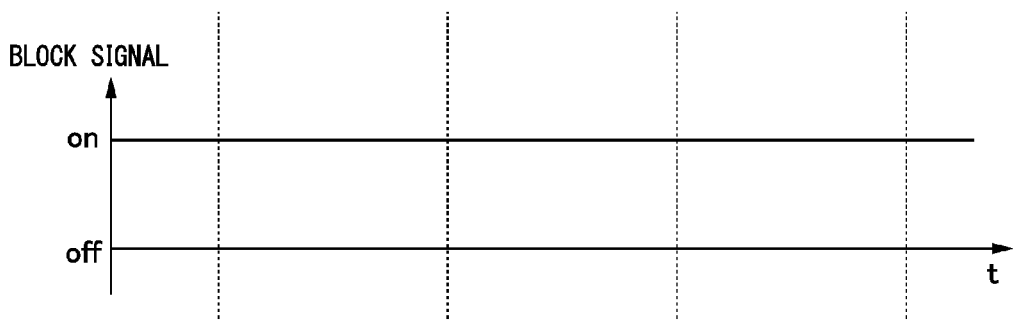
FIG. 5C is a chart illustrating operation of the semiconductor integrated circuit and the magnetic detecting device of the first embodiment related to the invention and illustrates a clock signal by a clock-signal generation circuit.

Furthermore, as shown in FIG. 5C, the clock signal is output from the clock-signal generation circuit M21 during the detection time where the excitation current of the triangular wave shown in FIG. 5A is provided.

The forward outage time tA is 0.1 to 5% of the period T, is more preferably 0.1 to 3% of the period T, and can be 0.1 to 1% of the period T.

The backward outage time tB is 0.1 to 5% of the period T, is more preferably 0.1 to 3% of the period T, and can be 0.1 to 1% of the period T.

Various setting methods can be adopted such as making the length of the forward outage time tA equal to that of the backward outage time tB, making one of the forward outage time tA and the backward outage time tB shorter than that of the other one, or making the lengths different from each other for each of the continuous triangular waves.

In addition, the stop signal of only one of the forward outage time tA and the backward outage time tB can be output.

Since the semiconductor integrated circuit M2 of the embodiment has the clock-signal control circuit M22 outputting the stop signal stopping the intensity-signal output Sout output from the signal processing circuit M23 in the forward outage time tA and the backward outage time tB, it is possible to maintain the linearity of the output by not outputting the intensity signal corresponding to the intensity of the external magnetic field at the time close to the apex point of the triangular wave.

Figure 6A:
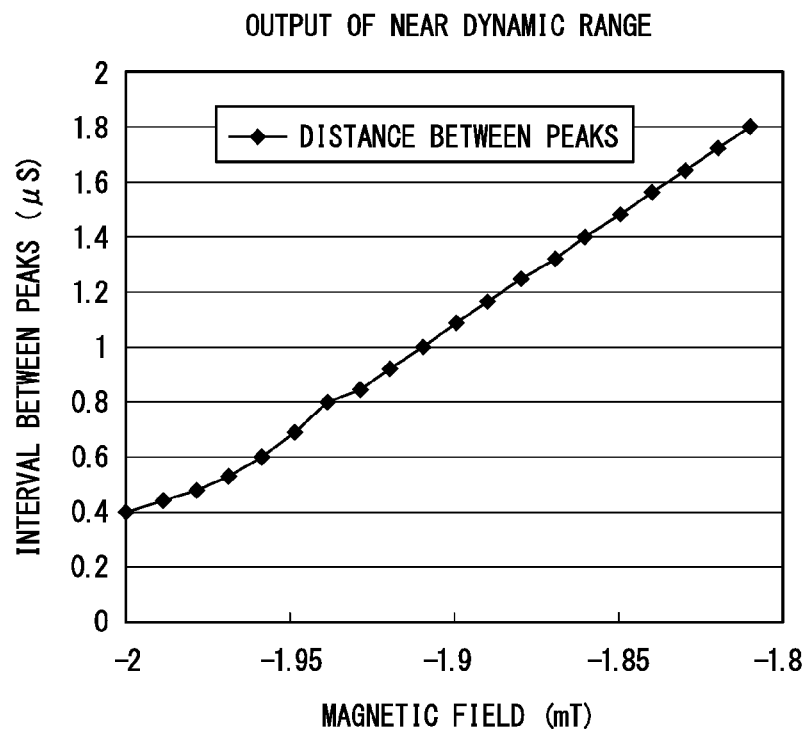
FIG. 6A is a chart illustrating the relationship an excitation magnetic field and an interval between peaks (time interval) at a region close to an end of a dynamic range in the semiconductor integrated circuit and the magnetic detecting device of the first embodiment related to the invention and illustrates the case where the output is not stopped by the stop signal.
Figure 6B:
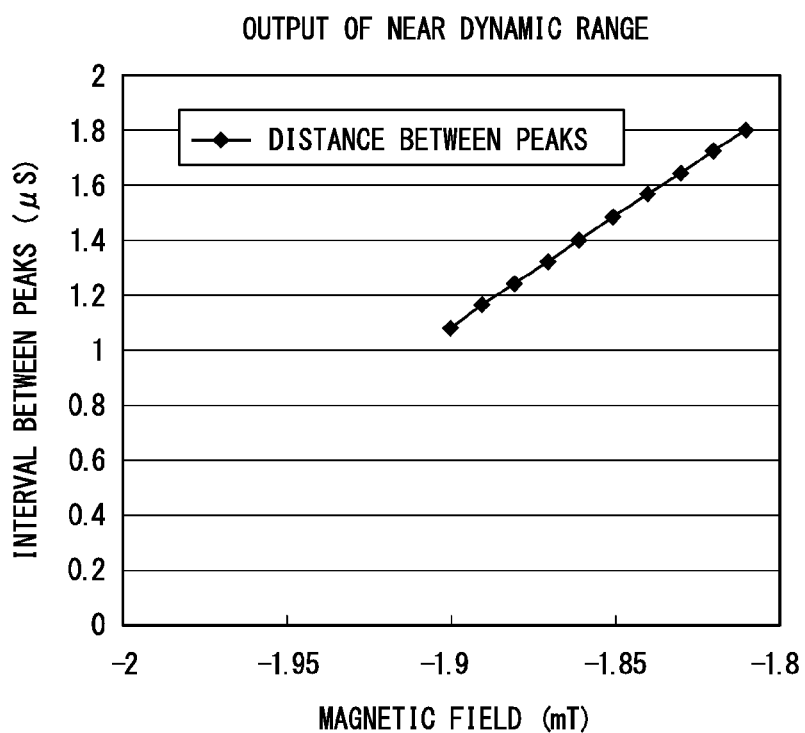
FIG. 6B is a chart illustrating the relationship the excitation magnetic field and the interval between peaks (time interval) at a region close to an end of a dynamic range in the semiconductor integrated circuit and the magnetic detecting device of the first embodiment related to the invention and illustrates the case where the output is stopped by the stop signal.

Specifically, as shown in FIG. 6A, in the case where the excitation magnetic field having the negative sign is up to near −2 mT in the triangular wave, it is found that the linearity can be maintained in the entire output range by outputting the stop signal in the outage time tA which is from near −1.9 mT to near −2 mT as shown in FIG. 6B and by not outputting the intensity signal corresponding to the intensity of the external magnetic field in the signal processing circuit M23.

Particularly, FIGS. 6A and 6B shows the region close to the apex point of the triangular wave, that is, the position close to the end of the dynamic range, and the linearity is maintained in the other range.

Figure 7A:
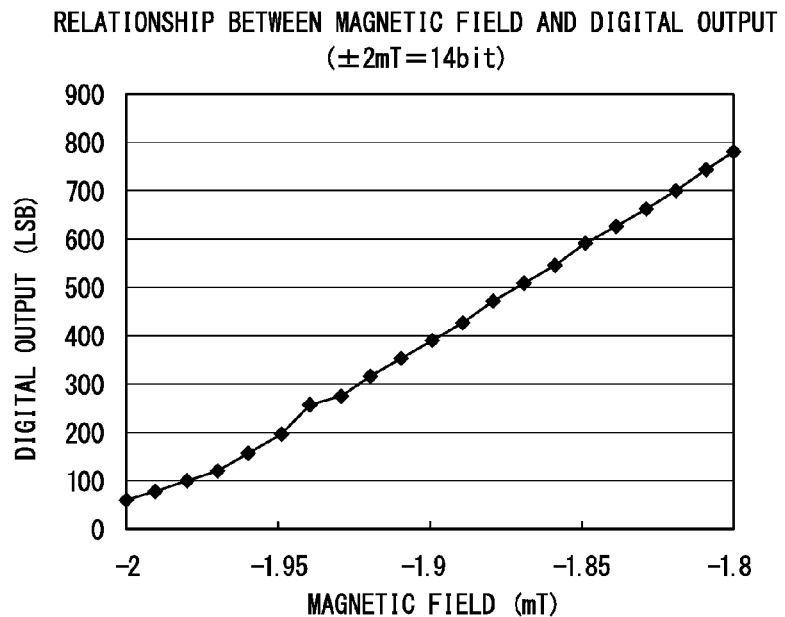
FIG. 7A is a chart illustrating the relationship an excitation magnetic field and a digital output (LSB) at a region close to an end of a dynamic range in the semiconductor integrated circuit and the magnetic detecting device of the first embodiment related to the invention and illustrates the case where the output is not stopped by the stop signal.
Figure 7B:
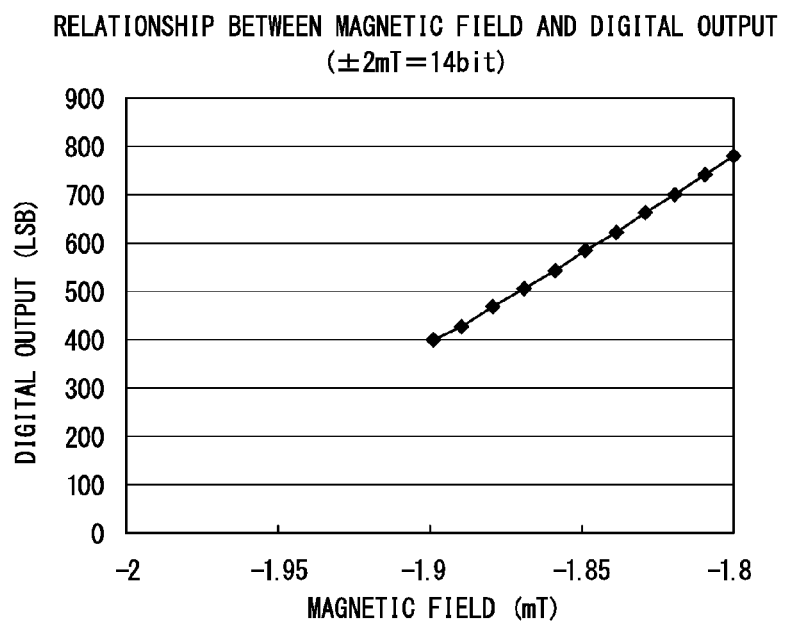
FIG. 7B is a chart illustrating the relationship the excitation magnetic field and the digital output (LSB) at a region close to an end of a dynamic range in the semiconductor integrated circuit and the magnetic detecting device of the first embodiment related to the invention and illustrates the case where the output is stopped by the stop signal.

Moreover, as the intensity signal corresponding to FIGS. 6A and 6B, a digital output is shown in FIG. 7.

In the case where the excitation magnetic field having the negative sign is up to near −2 mT and, for example, a digital output (LSB; Least Significant Bit) of 14 bits is output in this range, the upper limit of the digital output is approximately 15984.

Additionally, the digital output is the range of −0.9 mT to +1.9 mT which is an output range other than the peak point of the triangular waveform magnetic field due to the stop signal as described above in the embodiment.

Figure 8:
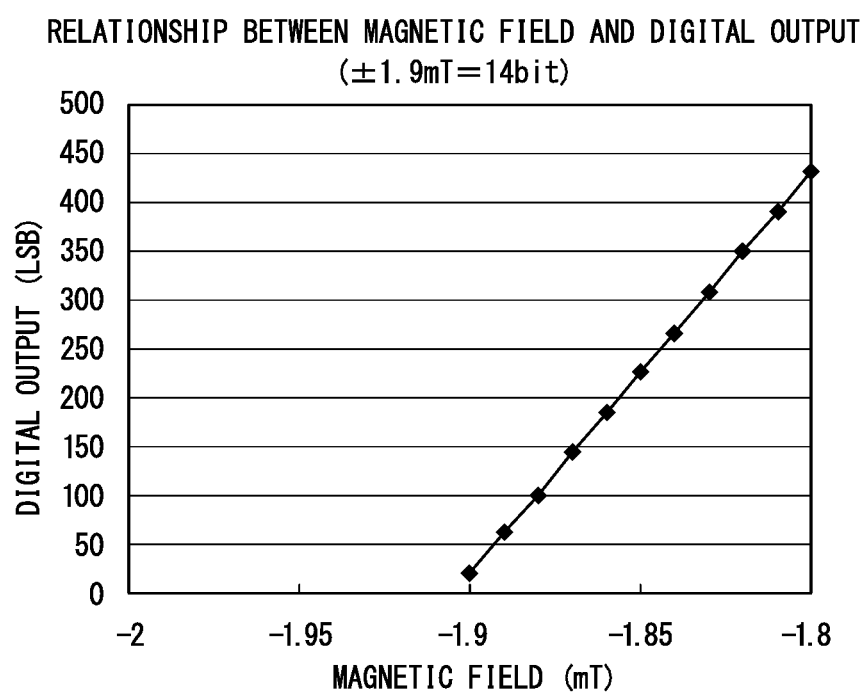
FIG. 8 is a chart illustrating the relationship between the excitation magnetic field and the interval between peaks (time interval) at the region close to the end of the dynamic range in the case where the output is stopped by the stop signal shown in FIG. 7 in the semiconductor integrated circuit and the magnetic detecting device of the first embodiment related to the invention.

Consequently, the output range is converted into, for example, a digital output (LSB) of 14 bits as shown in FIG. 8.

Accordingly, the upper limit of the digital output is 16382.

As a result, the full scale of the digital output can be used in a state where the linearity is maintained.

Hereinafter, a magnetic detecting device M of a second embodiment of the invention will be described.

The embodiment illustrate a specific constitution of a magnetic sensor unit by using an example.

Figure 15:
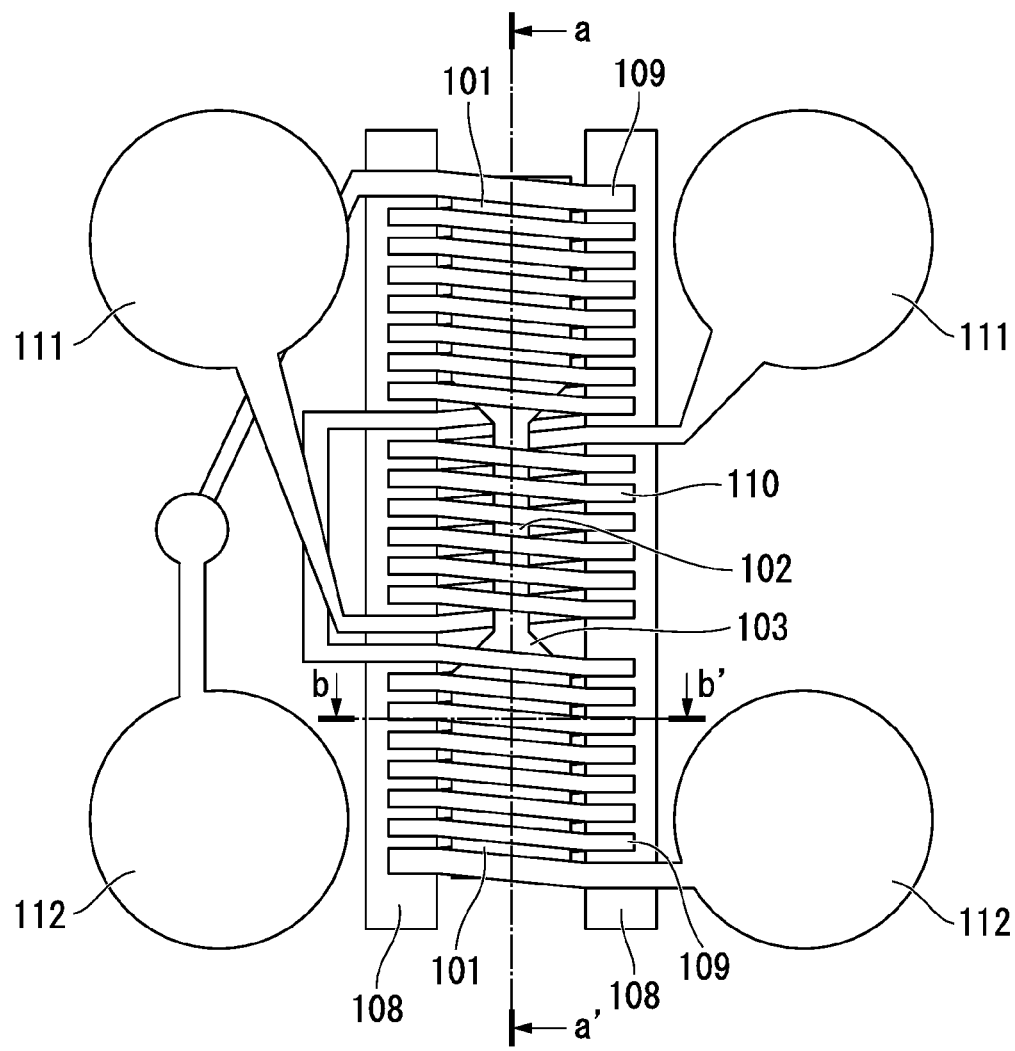
FIG. 15 is a top view schematically showing the magnetic sensor unit of a semiconductor integrated circuit and a magnetic detecting device of a second embodiment related to the invention.

FIG. 15 is a top view schematically showing a magnetic sensor unit related to the embodiment.

Figure 16:
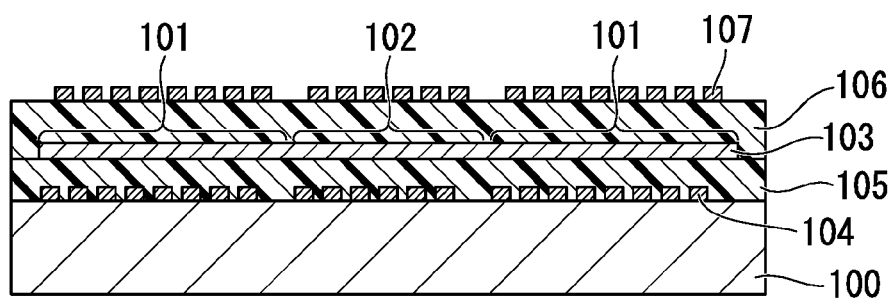
FIG. 16 is a cross-sectional view taken along the line a-a' of FIG. 15.

FIG. 16 is a cross-sectional view taken along the line a-a' of FIG. 15.

FIGS. 17A to 17E are cross-sectional views taken along the line b-b' of FIG. 15 and charts illustrating processes for manufacturing the magnetic sensor unit.

As show in FIGS. 15 and 16, the magnetic sensor unit of the embodiment includes a magnetic core 103, first wiring layers 104, a first insulating layer 105, a second insulating layer 106, second wiring layers 107, opening portions 108, and a substrate 100.

The magnetic core 103 includes end portions 101 located at both ends of the magnetic core 103 and a center portion 102 located at a center of the magnetic core 103.

The width of the end portion 101 is wider than the width of the center portion 102.

The first wiring layers 104 and the second wiring layers 107 constitutes first solenoidal coils 109 that are wound around the end portions 101 and a second solenoidal coil 110 that is wound around the center portion 102.

In the embodiment, the first solenoidal coils 109 that are wound around the end portions 101 are excitation coils functioning as an excitation unit.

The second solenoidal coil 110 that is wound around the center portion 102 is a pick-up coil (detecting coil).

In the embodiment, the end portions 101 are the excitation unit, the center portion 102 is the detection unit.

The processes for manufacturing the magnetic sensor unit of the embodiment will be illustrated with reference to FIGS. 17A to 17E.

Figure 17A:
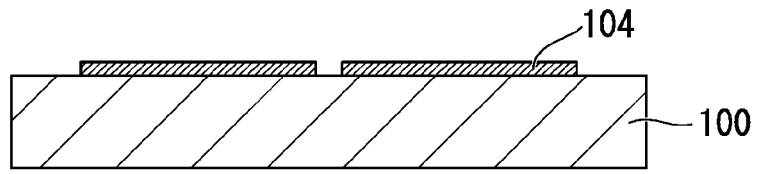
FIG. 17A is a cross-sectional view taken along the line a-a' of FIG. 15 and a diagram illustrating a process for manufacturing the magnetic sensor unit.

Firstly, as shown in FIG. 17A, the first wiring layers 104 used for forming a lower wiring of the solenoidal coil are formed on a non-magnetic substrate 100.

Figure 17B:
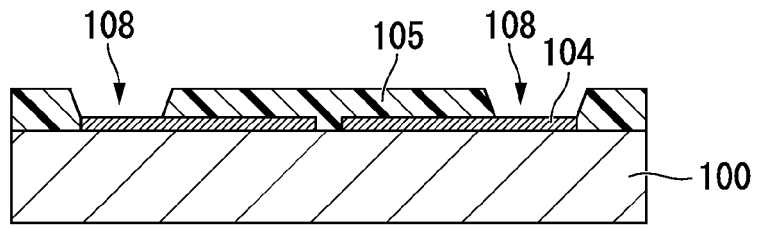
FIG. 17B is a cross-sectional view taken along the line a-a' of FIG. 15 and a diagram illustrating a process for manufacturing the magnetic sensor unit.

Subsequently, as shown in FIG. 17B, the first insulating layer 105 used for insulating the magnetic core 103 from the solenoidal coil is formed on the first wiring layer 104.

Here, the opening portions 108, at which the first wiring layers 104 are to be connected to the subsequently-formed second wiring layers 107 serving as an upper wiring of the solenoidal coil, are provided at the first insulating layer 105.

Figure 17C:
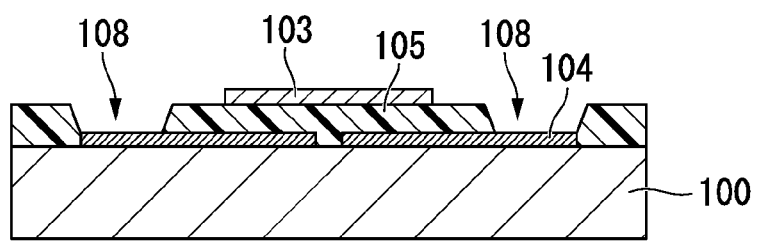
FIG. 17C is a cross-sectional view taken along the line a-a' of FIG. 15 and a diagram illustrating a process for manufacturing the magnetic sensor unit.

Subsequently, as shown in FIG. 17C, the magnetic core 103 formed of a soft magnetic film is formed on the first insulating layers 105.

As shown in FIG. 15, the magnetic core 103 formed of the soft magnetic film is formed so that the width thereof at the center portion 102 is shorter than the width thereof at the end portions 101.

Figure 17D:
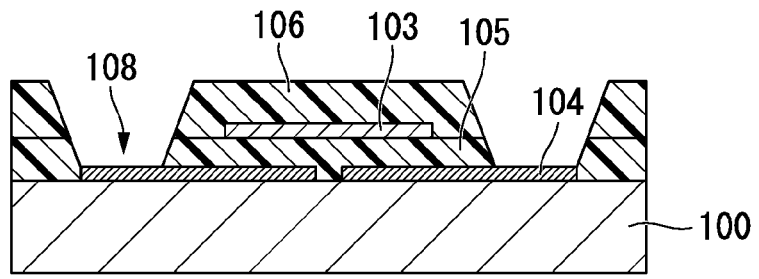
FIG. 17D is a cross-sectional view taken along the line a-a' of FIG. 15 and a diagram illustrating a process for manufacturing the magnetic sensor unit.

Subsequently, as shown in FIG. 17D, the second insulating layer 106 having the opening portions 108 provided at the connection portion between the first wiring layers 104 and the second wiring layers 107 is formed on the magnetic core 103.

Figure 17E:
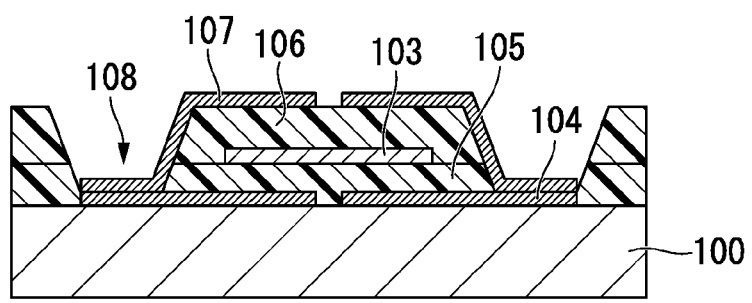
FIG. 17E is a cross-sectional view taken along the line a-a' of FIG. 15 and a diagram illustrating a process for manufacturing the magnetic sensor unit.

Furthermore, as shown in FIG. 17E, the second wiring layers 107 are formed on the second insulating layer 106 so as to connect the wirings adjacent to each other of the first wiring layers 104 at the end portions, and the solenoidal coil are thereby formed.

Since the wiring is connected to the adjacent wiring, a loop of the solenoidal coil does not close in a cross section.

Each of the first solenoidal coils 109 and the second solenoidal coil 110, which are formed of the first wiring layers 104 and the second wiring layers 107, is independently wound.

Specifically, the first solenoidal coils 109 are wound around the end portions 101 having a large width.

Additionally, the second solenoidal coil 110 is wound around the center portion 102 having a narrow width.

The first solenoidal coils 109 that are wound around the end portions 101 includes a third solenoidal coil, which is wound around the end portions 101 located at one end (first end), and a fourth solenoidal coil, which is wound around the end portions 101 located at the other end (second end opposite to first end).

The third solenoidal coil and the fourth solenoidal coil arranged at both ends of the magnetic core 103 are connected in series to the first wiring layers 104 or the second wiring layers 107 so that the directions of the magnetic fields generated therefrom are the same as each other.

Consequently, the third solenoidal coil and the fourth solenoidal coil wholly form the first solenoidal coils 109.

Electrode pads 111 used for connecting an external device to the center portion 102 are formed at both ends of the second solenoidal coil 110 that is wound around the center portion 102 located at the center of the magnetic core 103.

Electrode pads 112 used for connecting the external device to the magnetic core 103 are formed at both ends of two first solenoidal coils 109 that are wound around the end portions 101 connected in series located at both ends of the magnetic core 103.

It is preferable that the numbers of windings of the third solenoidal coil and the fourth solenoidal coil, which are wound around both ends of the magnetic core 103 be the same as each other and the third solenoidal coil and the fourth solenoidal coil be symmetrical to each other.

Particularly, FIG. 15 is a schematic view, and part of the lower wiring of the magnetic core 103 related to the first solenoidal coils 109 and the second solenoidal coil 110 is omitted in the view.

Additionally, the configurations of the first solenoidal coils 109 and the second solenoidal coil 110 are not limited to the configurations shown in FIG. 15.

The positional relationship between the first wiring layers 104 and the second wiring layers 107 in the embodiment is not limited to the configuration shown in FIG. 16.

Furthermore, the configuration of the magnetic sensor unit of the embodiment is not limited to the configuration shown in FIGS. 17A to 17E.

The end portions 101 of the magnetic core 103 are excited by providing electric power to the first solenoidal coils 109 which are wound around the end portions 101.

In contrast, an induced voltage is applied to the center portion 102 of the magnetic core 103, and the induced voltage is detected by the second solenoidal coil 110 which are wound around the center portion 102.

A temporal varying alternating current which is supplied from the external device through the electrode pads 112 is provided to the first solenoidal coils (excitation unit) 109 of the end portions 101 of the magnetic core 103, and the magnetic core 103 is thereby alternating-current excited.

The magnetic flux generated at the end portions 101 is induced to the center portion 102 of the magnetic core 103.

Consequently, the center portion 102 of the magnetic core 103 is also alternating-current excited, and a substantially pulsed induced voltage is generated at the second solenoidal coil (detecting coil) 110 of the center portion 102.

The induced voltage can be detected by an external detecting circuit through the second solenoidal coil 110 and the electrode pads 111.

Here, the alternating current which is provided to the first solenoidal coils 109 is desirably a triangular wave with a constant frequency.

In other cases, the above-described embodiment explains the structure shown in FIG. 15 as a structure of the magnetic core, the configuration of the magnetic core of the scope of this invention is not limited to the structure shown in FIG. 15, and other configurations may be adopted as long as the width of the end portion thereof is larger than the width of the center portion.

A seal layer covering the second wiring layers 107 may be formed in addition to the above-described constitution.

It is preferable that the thickness of the first wiring layer 104 be approximately 0.2 µm to 2 µm.

It is desirable that the thickness of the first insulating layer 105 be a sufficient thickness required for releasing an irregular configuration generated by the first wiring layers 104, specifically, the thickness thereof be 3 to 10 times the thickness of the first wiring layer 104.

Such wiring layers can be made of Cu, Al, or Au.

As a soft magnetic film forming the magnetic core 103, a zero-magnetostrictive Co system amorphous film, NiFe alloy, CoFe, alloy, or the like typified by CoNbZr, CoTaZr, or the like is desirably used.

The second wiring layers 107 can be formed of a barrier metal film such as Ti, Cr, or TiW.

As electrode pads and terminals used for connecting the external device to the magnetic sensor unit as necessary, a technique can be applied which uses a solder bump, a gold bump, a wire bonding, or the like generally used for a semiconductor device or a thin film device.

Figure 9:
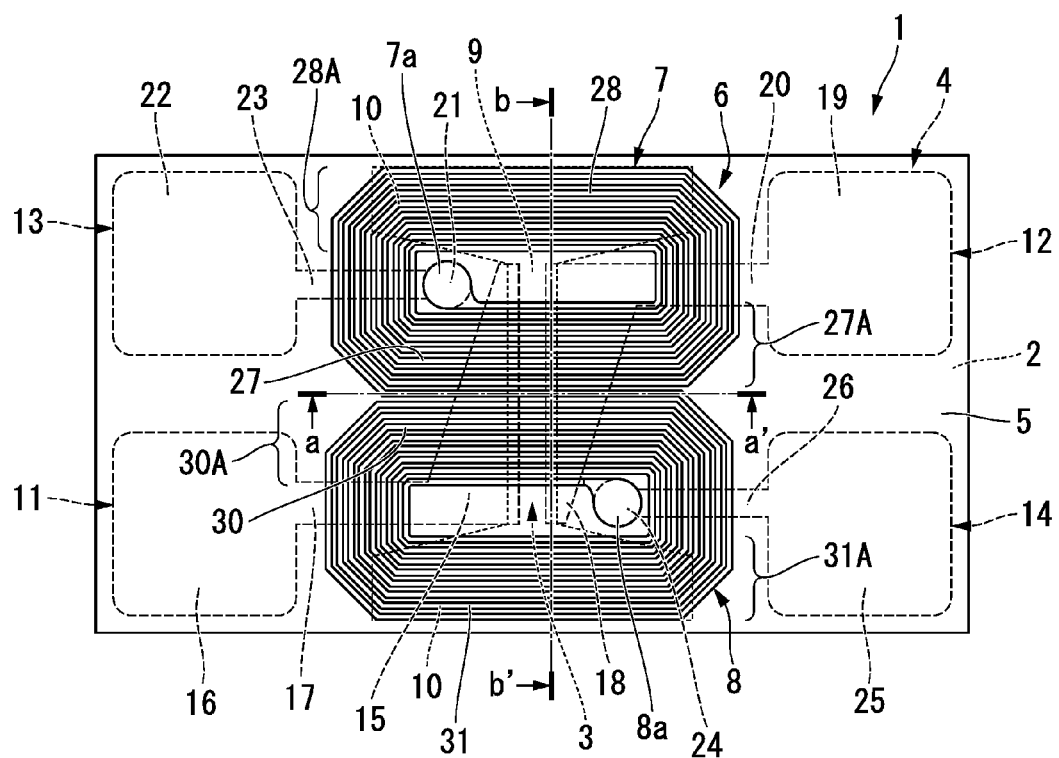
FIG. 9 is a plan view showing a magnetic sensor unit in a semiconductor integrated circuit and a magnetic detecting device of a third embodiment related to the invention.

FIG. 9 is a plan view showing a magnetic sensor unit of the magnetic detecting device of a third embodiment of the invention.

Figure 10:
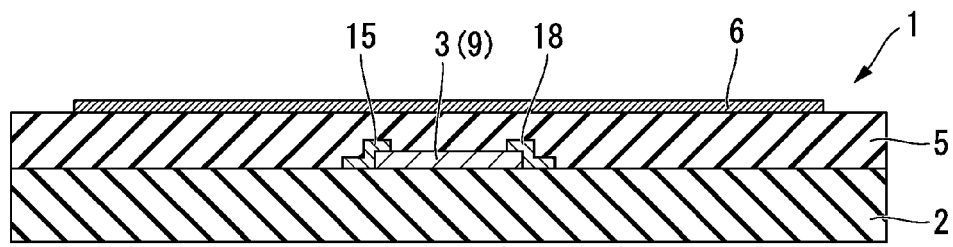
FIG. 10 is a vertical cross-sectional view showing the magnetic sensor unit shown in FIG. 9 taken along the line a-a' of FIG. 9.

FIG. 10 is a vertical cross-sectional view showing taken along the line a-a' of FIG. 9 of the magnetic sensor unit shown in FIG. 9.

Figure 11:
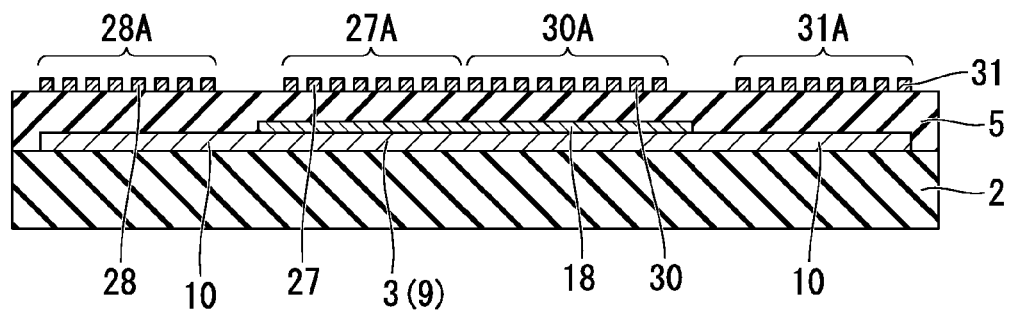
FIG. 11 is a vertical cross-sectional view showing the magnetic sensor unit shown in FIG. 9 taken along the line b-b' of FIG. 9.

FIG. 11 is a vertical cross-sectional view showing taken along the line b-b' of FIG. 9 of the magnetic sensor unit shown in FIG. 9.

Figure 12:
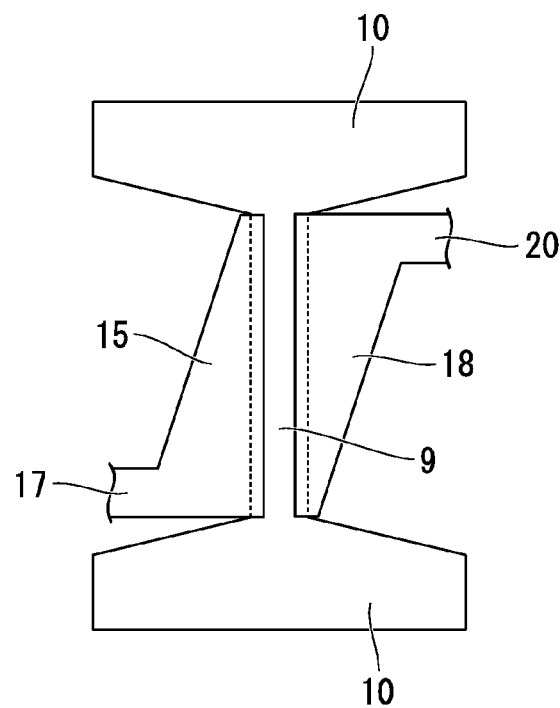
FIG. 12 is a plan view showing a magnetic core which is provided in the magnetic sensor unit shown in FIG. 9.

FIG. 12 is a plan view showing a magnetic core provided in the magnetic sensor unit shown in FIG. 9.

The magnetic sensor unit 1 shown in FIGS. 9 to 11 is configured to include a non-magnetic substrate 2, a magnetic core 3, a conductor layer 4, an insulating layer 5, and pick-up coils 6 (detecting coil).

The magnetic core 3 and the conductor layer 4 are provided on the non-magnetic substrate 2.

The pick-up coils 6 are provided above each part of the magnetic core 3 and the conductor layer 4 with the insulating layer 5 interposed therebetween.

The pick-up coils 6 is constituted of a first coil 7 and a second coil 8.

As shown in a plan view of FIG. 9, the winding direction (electrical current flowing direction) of the first coil 7 is opposite to the winding direction of the second coil 8.

Additionally, the first coil 7 and the second coil 8 are electrically connected in series and are arranged adjacent to each other at the center of an upper face of the non-magnetic substrate 2.

The non-magnetic substrate 2 is a substrate supporting each part constituting the magnetic sensor unit 1 of the embodiment.

As the non-magnetic substrate 2, a substrate made of a non-magnetic material such as silicon (Si), glass, ceramics, or the like may be used.

As shown in a plan view of FIG. 9, the magnetic core 3 includes a strip-shaped energizing portion (excitation unit) 9 and a pair of magnetic-flux collectors 10 provided at both the end portions of the energizing portion 9.

In addition, the entire magnetic core 3 is formed of a soft magnetic thin film as shown in an enlarged cross-sectional view of FIG. 11.

The soft magnetic thin film is not limited to a particular material as long as a material can apply uniaxial anisotropy, a soft magnetic thin film or the like can be used such as a $Co_{85}Nb_{12}Zr_3$ film, a FeNi alloy film, a FeSiAl alloy film, a CoFeSiB alloy film which form an amorphous composition.

A triangular wave current (electrical current temporally varies) is supplied to the energizing portion 9 through a first energizing electrode 15 and a second energizing electrode 18 described below in a width direction (a direction substantially parallel to forward direction lines 27 and 30 described later).

Because of this, the energizing portion 9 is energized in the longitudinal direction thereof.

Consequently, in a state where the magnetic sensor unit 1 is subjected to an external magnetic field, the magnetic flux of the external magnetic field is drawn into the energizing portion 9, and the energizing portion 9 is superimposed on the magnetic flux generated by action of the energization.

The configurations of the pair of the magnetic-flux collectors 10 are substantially the same as each other, each of the width of the magnetic-flux collectors 10 is greater than the width of the energizing portion 9.

The magnetic-flux collectors 10 are connected to both the end portions in the longitudinal direction of the strip-shaped energizing portion 9.

The entire configuration into which the magnetic-flux collectors 10 and the energizing portion 9 are integrated is an I-shape, and the magnetic-flux collectors 10 and the energizing portion 9 are formed at the center of the upper face of the non-magnetic substrate 2.

In addition, two spiral coils 7 and 8 are provided at the magnetic core 3 of the magnetic sensor unit 1.

The spiral coil 7 has a reverse-phase magnetic field generation portion 28A (first reverse-phase magnetic field generation portion) which is provided at the position separated from the center of the spiral coil 7 and at the position close to the long side of the non-magnetic substrate 2.

The spiral coil 8 has a reverse-phase magnetic field generation portion 31A (second reverse-phase magnetic field generation portion) which is provided at the position separated from the center of the spiral coil 8 and at the position close to the long side of the non-magnetic substrate 2.

In a plan view of FIG. 9, the magnetic-flux collectors 10 are arranged so as to overlap the reverse-phase magnetic field generation portions 28A and 31A.

The element which is arranged so as to overlap the reverse-phase magnetic field generation portion 28A is a first magnetic-flux collector, and the element which is arranged so as to overlap the reverse-phase magnetic field generation portion 31A is a second magnetic-flux collector.

The energizing portion 9 is formed on the non-magnetic substrate 2 in parallel with the line connecting the spiral centers of two spiral coils 7 and 8.

Each magnetic-flux collector 10 has a width greater than the width of the energizing portion 9.

The width of each magnetic-flux collector 10 gradually increases in the direction from the centers of the spiral coils 7 and 8 toward the long sides of the non-magnetic substrate 2.

As shown in FIG. 9, the magnetic-flux collector 10 has the configuration such that the width of the soft magnetic thin film forming the magnetic-flux collector 10 gradually spreads at the boundary between the energizing portion 9 and the magnetic-flux collector 10 or at the portion close to the boundary.

As shown in FIG. 9, the magnetic-flux collector 10 has an inclined portion oblique to the direction in which the energizing portion 9 extends.

In other cases, the magnetic-flux collector 10 is not limited to the configuration having the foregoing the inclined portion, and the width thereof may increase in a stepwise manner (step by step).

In other cases, the planar configuration of one of the magnetic-flux collectors 10 (first magnetic-flux collector) may be different from the planar configuration of the other of the magnetic-flux collectors 10 (second magnetic-flux collector), both of them may be asymmetric to each other, and both of them may be symmetrical to each other.

The action that draws an external magnetic field is generated at the pair of the magnetic-flux collectors 10 and the energizing portion 9; therefore, a large amount of the magnetic flux can be drawn by action of the energizing portion 9.

Additionally, it is possible to reduce the effect of a demagnetizing field generated at the magnetic core 3 at the time of the excitation.

As a result, it is possible to increase sensitivity of the magnetic sensor unit 1.

The conductor layer 4 has a first energizing conductor portion 11, a second energizing conductor portion 12, a first output conductor portion 13, and a second output conductor portion 14.

Such conductor portions are provided at corners of the non-magnetic substrate 2.

The first energizing conductor portion 11 is configured to include the first energizing electrode 15, a first energizing electrode pad 16, and a first energizing wiring 17.

The first energizing electrode 15 is provided so that part of the first energizing electrode 15 overlaps one of peripheralis portions extending along the longitudinal direction of the energizing portion 9 (first peripheralis portion, the peripheralis portion located at the left side of the energizing portion 9 in FIG. 9).

The first energizing electrode pad 16 is connected to an alternating-current source of a drive unit.

The first energizing wiring 17 connects the first energizing electrode 15 to the first energizing electrode pad 16.

Moreover, the second energizing conductor portion 12 is configured to include the second energizing electrode 18, a second energizing electrode pad 19, and a second energizing wiring 20.

The second energizing electrode 18 is provided so that part of the second energizing electrode 18 overlaps the other of the peripheralis portions extending along the longitudinal direction of the energizing portion 9 (second peripheralis portion located on opposite side of the first peripheralis portion, the peripheralis portion located at the right side of the energizing portion 9 in FIG. 9).

The second energizing electrode pad 19 is connected to an alternating-current source disposed outside the magnetic sensor unit 1.

The second energizing wiring 20 connects the second energizing electrode 18 to the second energizing electrode pad 19.

When the plane is seen in a vertical direction as shown in FIG. 9, the second energizing conductor portion 12 is formed at the position substantially point-symmetrical to the first energizing conductor portion 11 on the non-magnetic substrate 2.

When the alternating current is supplied to the first energizing conductor portion 11 from the alternating-current source connected to the first energizing electrode pad 16, the electrical current output from the first energizing electrode pad 16 is supplied to the energizing portion 9 through the first energizing wiring 17 and the first energizing electrode 15 and flows from the left to the right in the width direction of the energizing portion 9 (the direction from the first peripheralis portion toward the second peripheralis portion).

Furthermore, when the alternating current is supplied to the second energizing conductor portion 12 from the alternating-current source connected to the second energizing electrode pad 19, the electrical current output from the second energizing electrode pad 19 is supplied to the energizing portion 9 through the second energizing wiring 20 and the second energizing electrode 18 and flows from the right to the left in the width direction of the energizing portion 9 (the direction from the second peripheralis portion to the first peripheralis portion).

The electrical currents whose directions are inverse to each other alternately flow as stated above, therefore, the energizing portion 9 is excited in the longitudinal direction of the energizing portion 9.

In contrast, the first output conductor portion 13 is configured to include a first output electrode 21, a first output electrode pad 22, and a first output wiring 23, and is formed adjacent to the first energizing conductor portion 11.

The first output electrode 21 is electrically connected to the output terminal 7a close to the center of the first coil 7 of the pick-up coils 6.

The first output electrode pad 22 is connected to a detecting circuit located outside the magnetic sensor unit 1.

The first output wiring 23 connects the first output electrode 21 to the first output electrode pad 22.

Additionally, the second output conductor portion 14 is configured to include a second output electrode 24, a second output electrode pad 25, and a second output wiring 26, and is located at the position substantially point-symmetrical to the first output conductor portion 13 on the non-magnetic substrate 2.

The second output electrode 24 is connected to the output terminal 8a close to the center of the second coil 8 of the pick-up coils 6.

The second output electrode pad 25 is connected to a detecting circuit located outside the magnetic sensor unit 1.

The second output wiring 26 connects the second output electrode 24 to the second output electrode pad 25.

The induced voltage generated between the first coil 7 and the second coil 8 is detected by the detecting circuit as an output voltage generated between the first output electrode 21 and the second output electrode 24.

The insulating layer 5 is formed on the non-magnetic substrate 2 so as to insulate the magnetic core 3 and the conductor layer 4 from the pick-up coils 6.

The insulating layer 5 is entirely provided on the non-magnetic substrate 2, the magnetic core 3, and the conductor layer 4.

Through holes are provided on the insulating layer 5 at the positions corresponding to each of the output electrodes 21 and 24.

The through holes are filled with conductors which are used for electrically conducting an element disposed on an upper portion to an element disposed at a lower portion in the vertical direction of the non-magnetic substrate 2.

By means of this structure, the output electrode 21 is electrically connected to the output terminal 7a of the first coil 7, and the output electrode 24 is electrically connected to each output terminal 8a of the second coil 8.

As a material used for forming the insulating layer 5, insulating resins such as photosensitive polyimide as well as a metal oxide such as $SiO_2$ or a $Al_2O_3$ in addition to a metal nitride such as $Si_3N_4$, AlN, or the like can be used.

The first coil 7 and the second coil 8 constituting the pick-up coils 6 will be described.

Each of the first coil 7 and the second coil 8 is formed of a conductive thin film with a spiral pattern.

More specifically, each of the coils 7 and 8 is formed of a wiring (conductive thin film) extending in a counterclockwise direction from the center toward the outside.

Furthermore, the outermost-peripheral wirings of the coils 7 and 8 are continuous so as to form a shape like the number 8 over the entirety of the pick-up coils 6, that is, the coils 7 and 8 are connected to each other.

In the pick-up coils 6, the end portions of the pick-up coils 6, which are located close to the centers each of the coils 7 and 8, form the output terminals 7a and 8a outputting the induced voltage generated at the pick-up coils 6.

In other cases, each of the coils 7 and 8 may be formed by a wiring extending in a clockwise direction from the center toward the outside.

Here, a wiring structure of the first coil 7 will be illustrated.

The first coil 7 has a forward-direction line group (in-phase magnetic field generation portion) 27A and an inverse-direction line group (reverse-phase magnetic field generation portion) 28A.

The forward-direction line group 27A is formed of a plurality of forward direction lines 27 which are substantially parallel with the width direction of the energizing portion 9.

The inverse-direction line group 28A is arranged separately from the forward-direction line group 27A and is formed of a plurality of inverse direction lines 28 which are substantially parallel with the width direction of the energizing portion 9.

The forward-direction line group 27A is arranged at the position close to the second coil 8.

The inverse-direction line group 28A is provided at the position close to the long side of the non-magnetic substrate 2.

Furthermore, a wiring structure of the second coil 8 is similar to the wiring structure of the first coil 7, and the second coil 8 has a forward-direction line group (in-phase magnetic field generation portion) 30A and an inverse-direction line group (reverse-phase magnetic field generation portion) 31A.

The forward-direction line group 30A is formed of a plurality of forward direction lines 30 which are substantially parallel with the width direction of the energizing portion 9.

The inverse-direction line group 31A is arranged separately from the forward-direction line group 30A and is formed of a plurality of inverse direction lines 31 which are substantially parallel with the width direction of the energizing portion 9.

The forward-direction line group 30A is arranged at the position close to the first coil 7.

The inverse-direction line group 31A is provided at the position close to the long side of the non-magnetic substrate 2.

Consequently, for each of the coils 7 and 8, each of the forward direction lines 27 and 30 overlaps the energizing portion 9 so as to stride across the energizing portion 9 in the width direction, and each of the inverse direction lines 28 and 31 overlaps the magnetic-flux collectors 10 as shown in a plan view of FIG. 9.

Particularly, in the embodiment, the in-phase magnetic field generation portion of the first coil 7 and the second coil 8 is the region between the central portions of the first coil 7 and the second coil 8, that is, the region between the central portion of the first coil 7 and the central portion of the second coil 8.

In contrast, the region from each of the central portions of the first coil 7 and the second coil 8 to the near outside of the non-magnetic substrate 2 (long side), for example, the region located at the upper central portion of the first coil 7 and the region located at the lower central portion of the second coil 8 in FIG. 9 are the reverse-phase magnetic field generation portions.

The lengths of the above-described structure of the energizing portion 9 are not limited to specific lengths. For use as an electronic compass, it is envisioned that the longitudinal combined length of the energizing portion 9 and the magnetic-flux collectors 10 be 0.5 mm, the length of the energizing portion 9 can be, approximately 250 µm, the width thereof can be approximately 30 µm, and the width and the length of the magnetic-flux collector 10 can be approximately 125 µm as an example.

Subsequently, operation of the magnetic sensor unit 1 having the aforementioned constitution will be illustrated.

In the explanation described below, the operation of the magnetic sensor unit 1 will be described so as to add the explanation to the above-described first embodiment.

The triangular wave current supplied from the alternating-current source of the drive unit M15 is provided to the energizing portion 9 through each of the energizing electrodes 15 and 18 and flows along the width direction of the energizing portion 9.

Because of this, the energizing portion 9 is excited and the magnetic flux following the B-H curve is generated in the longitudinal direction thereof.

As shown in FIG. 2B, the magnetic flux is generated in the energizing portion 9 while alternately varying the longitudinal direction of the magnetic flux.

The magnetic flux generated in the energizing portion 9 intersects with each of the forward direction lines 27 and 30 of the pick-up coils 6 and generates an induced voltage (induced current) for each of the forward-direction line groups (in-phase magnetic field generation portion) 27A and 30A.

Subsequently, the induced voltage generated from the pick-up coils 6 is detected at each of the output terminals 7a and 8a of the pick-up coils 6 as an output voltage, that is, a spike wave.

The magnetic sensor unit 1 configured as described above has the structure exciting the energizing portion 9 in the longitudinal direction thereof by directly providing an electrical current to the energizing portion 9 of the magnetic core 3 without using a conventionally-required excitation coil, and it is thereby possible to obtain the following effects.

(1) It is possible to omit a process for winding an excitation coil around the magnetic core 3, and it is thereby possible to simply form the structure thereof.

(2) Since it is possible to omit a necessary region used for winding an excitation coil, it is possible to wind the pick-up coils 6 around the omitted region. As a result, since high output can be obtained, it is possible to improve signal-to-noise ratio.

(3) In the case where the magnetic core 3 is excited by an excitation coil, if the length of the magnetic core 3 is short, the effect of a demagnetizing field increases and the excitation efficiency decreases, therefore, energization with a high electrical current is necessary. In contrast, when the magnetic core 3 is excited by directly providing an electrical current, it is possible to reduce the effect of a demagnetizing field at the time of the excitation.

For this reason, operation can be carried out by a low electrical current, and it is possible to reduce consumed power.

(4) Additionally, since the effect of a demagnetizing field is low at the time of the excitation, it is possible to downsize a sensing device, it is possible to realize a downsized and thinned electronic compass.

Moreover, since a spiral coil is used as the pick-up coils 6 and the in-phase magnetic field generation portions 27A and 30A of the spiral coil are arranged at the position close to the energizing portion 9 of the magnetic core 3 in the magnetic sensor device 1 of the embodiment, it is possible to obtain the following effects.

(A) It is possible to remove the effect due to variation in the magnetic flux in the reverse-phase magnetic field generation portions 28A and 31A, and it is possible to improve signal-to-noise ratio.

(B) Since the region of the soft magnetic thin film, which is arranged at the reverse-phase magnetic field generation portions 28A and 31A, can be used as a magnetic flux collector, it is possible to improve the sensitivity.

Because of that, it is possible to downsize the magnetic sensor device 1 while ensuring the sensitivity, the output, the signal-to-noise ratio.

In addition, similarly to a parallel flux-gate sensor, the direction of the magnetic flux generated by excitation of the energizing portion 9 is the longitudinal direction of the energizing portion 9 in the magnetic sensor device 1.

Therefore, in the case where a triangular wave current is provided to the energizing portion 9 as described above, the spike-shaped voltage waveform output at the timing of switching the polarity of the triangular wave current is detected, the time interval in which the spike-shaped voltage waveform is generated is measured using a counter, and it is thereby possible to calculate the intensity of the external magnetic field based on the time interval.

According to the foregoing method of detecting a magnetic field, since it is possible to remove the effect of hysteresis when calculating the intensity of the external magnetic field and digital detection using a counter can be carried out, it is possible to remove the effect of error in AD conversion.

For this reason, linearity of detected values is reliably obtained, the intensity of the external magnetic field can be detected with a high level of accuracy.

In other cases, in the magnetic sensor unit 1 of the embodiment, configurations of members constituting the magnetic sensor unit 1 are not limited to the above-described configuration.

Hereinbelow, a magnetic sensor unit of a magnetic detecting device of a fourth embodiment of the invention will be described with reference to drawings.

Figure 13:
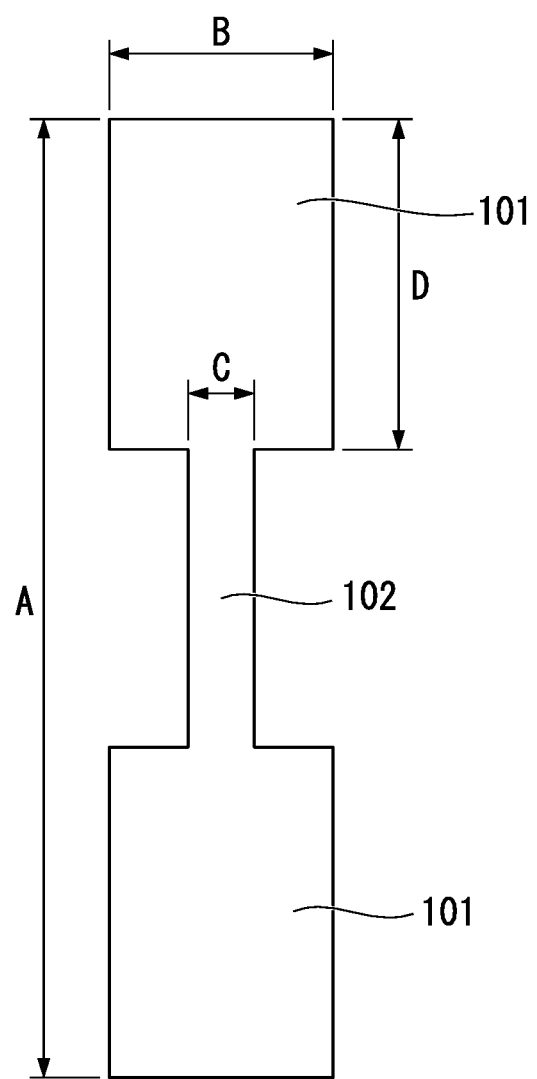
FIG. 13 is a plan view showing a magnetic core of the magnetic sensor unit in a semiconductor integrated circuit and a magnetic detecting device of a fourth embodiment related to the invention.
Figure 14:
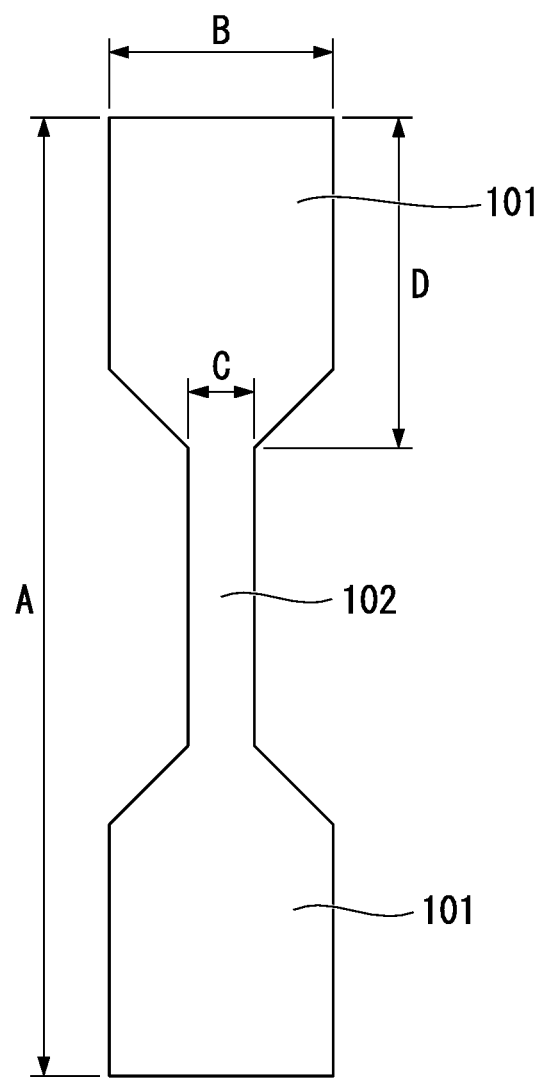
FIG. 14 is a plan view showing an example of the magnetic core of the magnetic sensor unit in the semiconductor integrated circuit and the magnetic detecting device of the fourth embodiment related to the invention.

FIGS. 13 and 14 are plan views showing an example of configuration of a magnetic core in the magnetic sensor unit related to the embodiment.

The magnetic core of the magnetic sensor unit of the embodiment has the end portions 101 and the center portion 102 as shown in FIGS. 13 and 14.

The width B of the end portions 101 is greater than the width C of the center portion 102.

The length A of the magnetic core in the longitudinal direction thereof is 1 mm or less, desirably 0.5 mm or less.

The ratio B/D of the width B of the end portion 101 to the length D of the end portion 101 in the longitudinal direction thereof is less than 1.

The longitudinal direction of the magnetic core of the magnetic sensor unit coincides with a magnetic-sensing direction of the magnetic sensor unit.

Although not shown in FIGS. 13 and 14, the excitation coils are wound around the end portions 101 and a pick-up coil is wound around the center portion 102.

FIG. 13 is a plan view showing an example of an edge portion of the magnetic core having an angled shape.

FIG. 14 is a plan view showing an example of the magnetic core having an inclined portion which is provided at the boundary between the end portion 101 and the center portion 102.

In order to prevent the magnetic flux from being locally saturated at the angle portion of magnetic core, it is desirable that the inclined portion be provided at the boundary between the end portion 101 and the center portion 102 as shown in FIG. 14.

In this case, when the length including the end portions 101 and the inclined portion in the longitudinal direction is represented as D, it is desirable that the ratio B/D of the width B of the end portion 101 to the length D of the end portion 101 in the longitudinal direction thereof be less than 1.

The ratio of the length of a magnetic thin film in the film thickness direction to the length thereof in the direction parallel to the surface thereof is large such as several hundred to several thousand.

For this reason, there is a difference in the demagnetizing factor between the length in the film thickness direction and the length in the direction parallel to the surface, the demagnetizing factor in the length in the direction parallel to the surface is extremely low.

A demagnetizing factor is determined based on the ratio of the size in the longitudinal direction to the size in the width direction when the magnetic thin film having a configuration extending in the longitudinal direction thereof is patterned.

In this case, since the demagnetizing factor in the longitudinal direction is low and the demagnetizing factor in the width direction is large, the longitudinal direction in shape anisotropy is easy axis.

As described above, the magnetic sensor unit of the embodiment has the end portions 101 having the width wider than that of the center portion 102 at the magnetic core, and the width B of the end portion 101 is shorter than the length D of the end portion 101 in the longitudinal direction thereof.

The easy axis of the end portion 101 in shape anisotropy is the longitudinal direction of the magnetic sensor unit.

Because of this, variation in the magnetic flux density in the core, which is due to the magnetic field orthogonal to the magnetic-sensing direction, is low, and the sensitivity characteristics in the other axis is excellent.

By means of this structure, an electronic compass with a high level of azimuth accuracy can be configured.

(Formula 4)

$$t_2 - t_1 = \frac{Hext}{Hexc} \cdot \frac{T}{2} \qquad \text{Equation (3)}$$

It is found that variation in the time interval $t_2$-$t_1$ with respect to the external magnetic field depends on the ratio Hext/Hexc of the external magnetic field Hext to the magnetic field Hexc generated by the excitation coil and on the triangular wave period T based on the above-described Equation (3).

The sensitivity S=d ($t_2$-$t_1$)/dHext relative to the external magnetic field is represented as S=T/(2·Iexc×α) using a current amplitude Iexc which is provided to the excitation coil, a generated magnetic field per unitary current which flows into the excitation coil, that is, excitation efficiency α, and the triangular wave period T.

For this reason, the higher the excitation current, the lower the sensitivity S of the sensor.

The larger the triangular wave period T, that is, the lower the excitation frequency fexc, the higher the sensitivity S of the sensor.

The excitation efficiency α is the value which is determined by the number of windings of the magnetic core and the coil which constitute the magnetic sensor unit.

As the excitation efficiency a becomes higher, the flux-gate sensor can be driven by the lower electrical current.

Additionally, under Equation (3), when Hext=Hexc, Equation (3) represents 0; at this time, Hext is the upper limit in the measurement range of the magnetic field.

Since the Hexc is represented by Hexc=α×Iexc, the higher the excitation efficiency α, the wider the measurement range of the magnetic field in the case where the driving is carried out at the same values of the electrical current.

Next, an electronic compass of an embodiment of the invention will be described.

Figure 18:
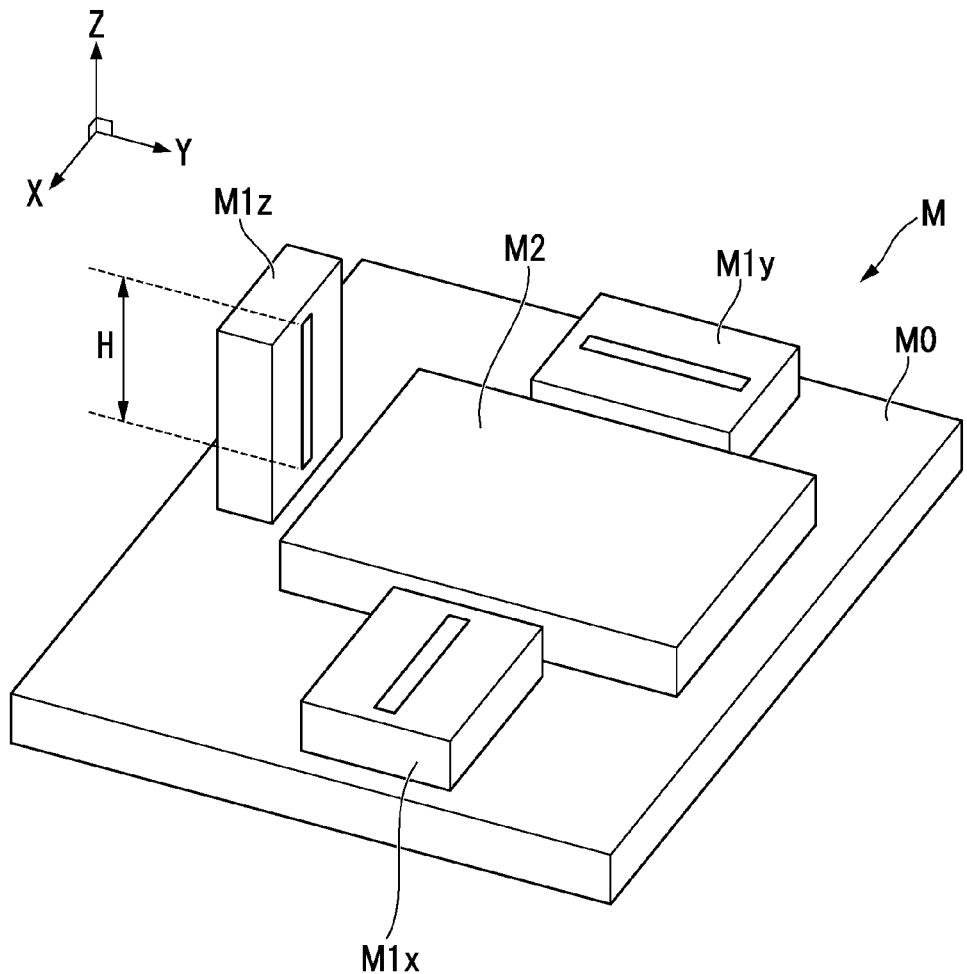
FIG. 18 is a perspective view showing an electronic compass of an embodiment related to the invention.

FIG. 18 is a schematic perspective view showing an electronic compass related to the embodiment.

The electronic compass shown in FIG. 18 has a constitution in which a first flux gate (X-axis) sensor M1x, a second flux gate (Y-axis) sensor M1y, a third flux gate (Z-axis) sensor M1z, and a signal processing integrated circuit (semiconductor integrated circuit) M2 are arranged on one substrate M0.

Each of the first flux-gate sensor M1x, the second flux-gate sensor M1y, the third flux-gate sensor M1z is the magnetic sensor unit M1 which is illustrated in the above-described embodiment.

Specifically, the first flux-gate sensor M1x and the second flux-gate sensor M1y are arranged so that each surface on which the sensor is formed is parallel to a substrate surface constituting the electronic compass and so that the magnetic-sensing directions thereof are orthogonal to each other.

Additionally, the third flux-gate sensor M1z is disposed so as to be substantially vertical to the substrate surface constituting the electronic compass.

At this time, regarding the first flux-gate sensor M1x, the second flux-gate sensor M1y, and the third flux-gate sensor M1z, it is desirable that the regions thereof excluding terminals to be connected to the external device, that is, the configurations of the portions forming a magnetic core, an excitation unit, a detecting coil be the same as each other.

The reason is that, by aligning the characteristics of the first flux-gate sensor M1x, the second flux-gate sensor M1y, and the third flux-gate sensor M1z, it is not necessary to correct variations in the characteristics of each sensor and it is possible to simplify the electronic circuit.

Furthermore, the third flux-gate sensor M1z is mounted on and substantially vertical to the substrate surface.

Consequently, in order to reduce the thickness of the electronic compass, it is desirable that the length of the magnetic-sensing direction of the third flux-gate sensor M1z be less than or equal to 1 mm, preferably, approximately 0.5 mm.

Moreover, the semiconductor integrated circuit M2 is provided with a circuit functioning as the drive unit M15, a circuit functioning as the detection unit M14, and a selector switching connections between the above-described circuits and the first flux-gate sensor M1x, the second flux-gate sensor M1y, and the third flux-gate sensor M1z in addition to the above-described semiconductor integrated circuit M2.

Here, the semiconductor integrated circuit M2 has a counter M21 counting the number of the timings at which an induced voltage is generated, a counter control circuit M22 outputting the stop signal, and the signal processing circuit M23.

The circuit functioning as the drive unit M15 supplies a triangular wave current having a constant frequency to the excitation unit of each flux-gate sensor.

The circuit functioning as the detection unit M14 detects the induced voltage which appears in the detecting coil M13.

According to the foregoing constitution, the first flux-gate sensor M1x, the second flux-gate sensor M1y, and the third flux-gate sensor M1z sequentially measure each magnetic field in three-axial directions, the calculation is carried out, and it is thereby possible to realize an electronic compass having low error in azimuth.

In addition, in the electronic compass of the invention, a structure may be adopted in which a circuit including the counter control circuit M22 outputting at least a stop signal is provided in each of the first flux-gate sensor M1x, the second flux-gate sensor M1y, and the third flux-gate sensor M1z.

In this case, output maintaining linearity can be carried out in each of the first flux-gate sensor M1x, the second flux-gate sensor M1y, and the third flux-gate sensor M1z.

Figure 19:
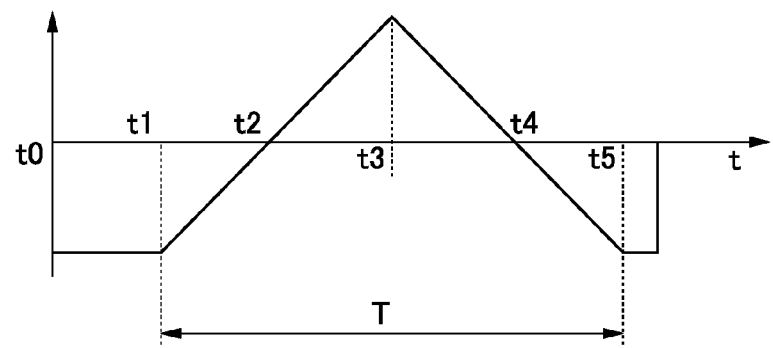
FIG. 19 illustrates an example of an excitation waveform of an embodiment of the semiconductor integrated circuit and the magnetic detecting device related to the invention.

In each of the aforementioned embodiments, the detection methods are illustrated using a plurality of continuous triangular waves having the same shape, however, a detection method using a single triangular wave shown in FIG. 19 can be adopted.

In this case, the triangular wave is set so that the magnitude of the excitation magnetic field at the apex point of the triangular wave is same as the magnitude of a previous excitation magnetic field at time $t_1$ at which the detection time starts.

Consequently, after the excitation is carried out by the triangular wave, it is preferable that the triangular wave be maintained so that the excitation magnetic field at the apex point of the triangular wave is the same as that of a prior triangular wave even after time $t_5$ at which the detection time is completed.

In this case, the outage time at which a stop signal is output is also set as described above with respect to the triangular wave period T.

Next, an embodiment of an ammeter utilizing the flux-gate sensor of the invention (magnetic detecting device) will be described.

Figure 22:
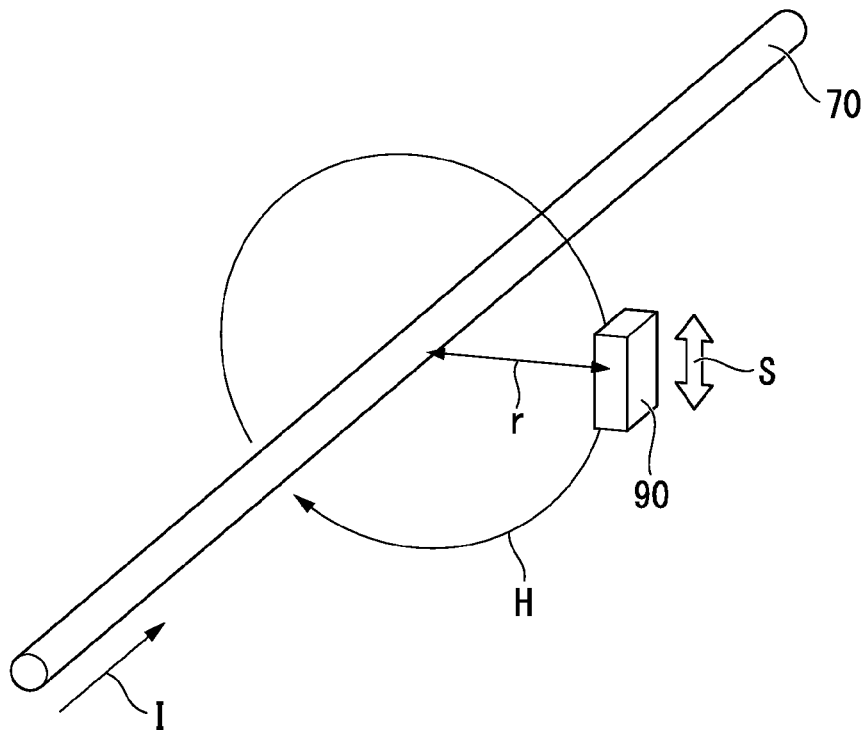
FIG. 22 is a schematic perspective view showing an example of use of an ammeter utilizing a flux-gate sensor serving as a magnetic detecting device related to the invention.

FIG. 22 is a schematic perspective view showing an embodiment of an ammeter 90 utilizing the flux-gate sensor of the invention.

Figure 23:
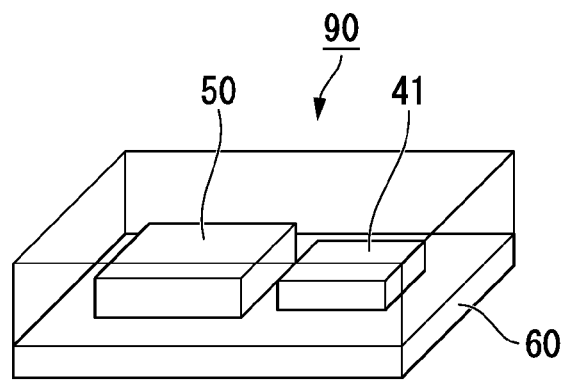
FIG. 23 is a schematic perspective view showing a structure of an ammeter utilizing a flux-gate sensor serving as a magnetic detecting device related to the invention.

FIG. 23 is a schematic perspective view showing a structure of the ammeter 90 utilizing the flux-gate sensor of the invention.

The ammeter 90 has a constitution in which, for example, as shown in FIG. 23, a magnetic sensor 41 and a signal processing integrated circuit 50 converting the magnetic field detected by the magnetic sensor 41 into a current value are provided on a printed substrate 60.

The flux-gate sensor of the invention is applied to the magnetic sensor 41 and the ammeter 90 is thereby configured.

As shown in FIG. 22, when an electrical current flows in a conductor (conductive wire) 70, a magnetic field H is concentrically generated around the conductor 70.

The magnetic field is represented as $H=I/(2\pi r)$ where the current value flowing in conductor 70 is represented as I and the distance between the ammeter 90 and the conductor 70 is represented as r.

As represented by the formula, the closer the conductor (conductive wire) 70, the stronger the magnetic field H (the higher the magnetic flux density).

Additionally, the higher the electrical current flowing in the conductor (conductive wire) 70, the greater the magnetic field H is generated.

When applying an electrical current I to the linear conductor (conductive wire) 70 as shown in, for example, FIG. 22, a magnetic field H is concentrically generated around the conductive wire 70 in a plane perpendicular to the conductive wires 70.

When an electrical current flows in the direction represented by the arrow I in FIG. 22, the direction of the magnetic field is the direction represented by the arrow H.

It is possible to measure the magnitude of the electrical current I flowing in the conductive wire 70 by disposing the ammeter 90 at the position close to the conductive wire 70 and by detecting the magnitude of the magnetic field H generated by the electrical current I flowing in the conductive wire 70.

The closer the conductive wire 70, the higher the magnetic flux density of the magnetic field H generated by the electrical current I.

For this reason, it is possible to effectively measure a current value with a high level of sensitivity by disposing the conductive wire 70 as close as possible to the ammeter 90.

Moreover, it is preferable that the magnetic sensor (flux-gate sensor) 41 be disposed in the ammeter 90 so that the magnetic-sensing direction S of the magnetic sensor (flux-gate sensor) 41 is parallel to the direction of the magnetic field H generated by the electrical current I.

Next, a different embodiment of an electronic compass utilizing the flux-gate sensor of the invention will be described.

Figure 24:
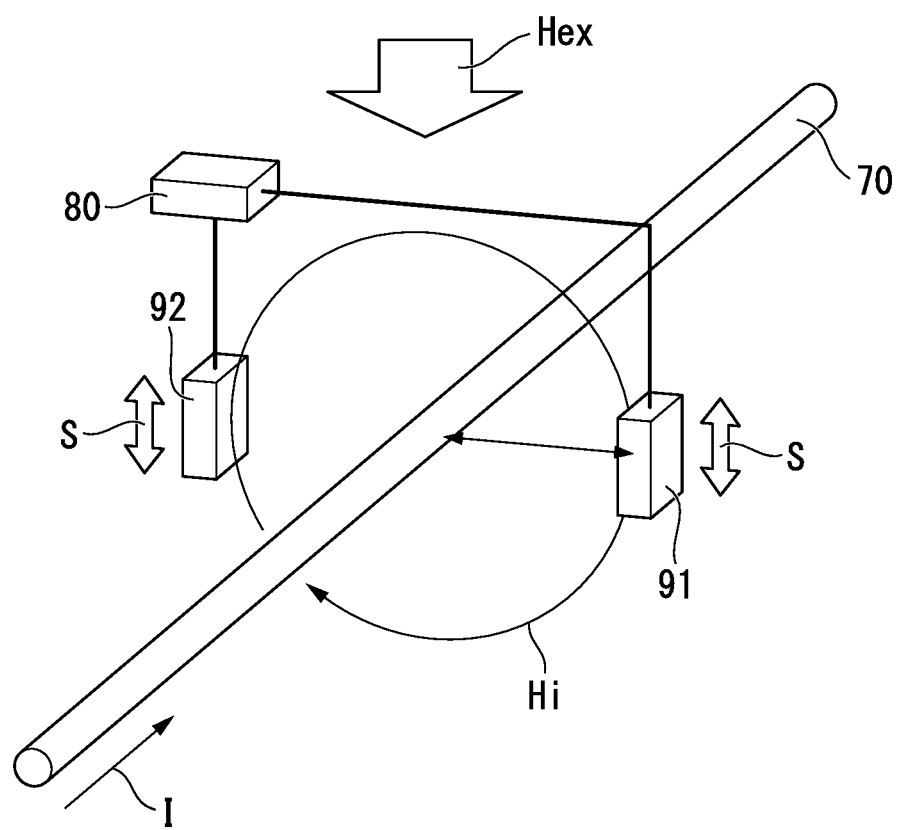
FIG. 24 is a schematic perspective view showing another example of use of an ammeter utilizing a flux-gate sensor serving as a magnetic detecting device related to the invention.

FIG. 24 is a schematic perspective view showing a different embodiment of an ammeter utilizing the flux-gate sensor of the invention.

In FIG. 24, two ammeters (a first ammeter 91 and a second ammeter 92) are disposed at the positions close to the conductive wire 70.

The first ammeter 91 and the second ammeter 92 have a structure which is the same as that of the ammeter 90 shown in FIG. 23.

A calculation circuit 80 is connected to the first ammeter 91 and the second ammeter 92.

The first ammeter 91 and the second ammeter 92 detects a magnetic field Hi generated by the electrical current Ii flowing in the conductive wire 70.

Specifically, the first ammeter 91 detects a magnetic field Ha, the second ammeter 92 detects a magnetic field Hb, and they output it to the calculation circuit 80.

The calculation circuit 80 calculates the magnetic field Hi based on the magnetic field Ha and the magnetic field Hb and outputs the magnitude of the electrical current I flowing in the conductive wire 70 based on the intensity of the magnetic field Hi.

In the first ammeter 91 and the second ammeter 92, the flux-gate sensor 41 provided in each ammeter is disposed on the substrate 60 so that the magnetic-sensing direction S of the flux-gate sensor 41 is parallel to the direction of the magnetic field H.

Additionally, the distances from the conductive wire 70 to the first ammeter 91 and to the second ammeter 92 are the same as each other, and the first ammeter 91 and the second ammeter 92 are disposed at positions which are symmetrical to each other with respect to the conductive wire 70.

Even where a noise magnetic field Hex is applied from the outside to the measurement system, since the measurement system (measurement device) has the above-described constitution, the extrinsic noise magnetic field Hex is compensated by calculating output values output from the first ammeter 91 and the second ammeter 92, and it is thereby possible to accurately calculate the electrical current I flowing in the conductive wire 70.

Hereinbelow, details will be described.

it is presumed that, in the measurement system which measures the current value of the electrical current I by detecting the magnetic field Hi generated by the electrical current I flowing in the conductive wire 70, an extrinsic noise magnetic field Hex is applied to the measurement system.

At this time, the magnetic field Ha detected by the first ammeter 91 can be represented as Ha=Hi+Hex.

The magnetic field Hb detected by the second ammeter 92 can be represented as Hb=−Hi+Hex.

The direction of the magnetic field H generated by the electrical current Ii is the opposite direction in the position of the first ammeter 91 and the position of the second ammeter 92.

Based on the above-described two formulas, Hex=(Ha+Hb)/2 and Hi=(Ha−Hb)/2 are obtained.

Particularly, the magnitude of the external magnetic field noise Hex is clarified, and it is possible to detect the magnitude of Hi except for the external magnetic field noise Hex.

Because of this, even where the extrinsic noise magnetic field Hex is applied, it is possible to accurately measure a current value of the electrical current I flowing in the conductive wire 70.

Additionally, in the case of using a time-resolved flux gate magnetic sensor which detects the magnetic field intensity based on the time difference between the pickup waveforms appearing in the pick-up coil as described in the invention, the range of measurable magnetic field intensity thereof is broader than that of the other system.

That is, measurement can be carried out with a high level of output linearity in the range of a high magnetic field to a low magnetic field.

Therefore, the magnetic sensor of the invention is applicable to an ammeter used for measuring the magnetic field generated by a low-electrical current such as approximately 10 to 20 A.

EXAMPLES

Figure 20:
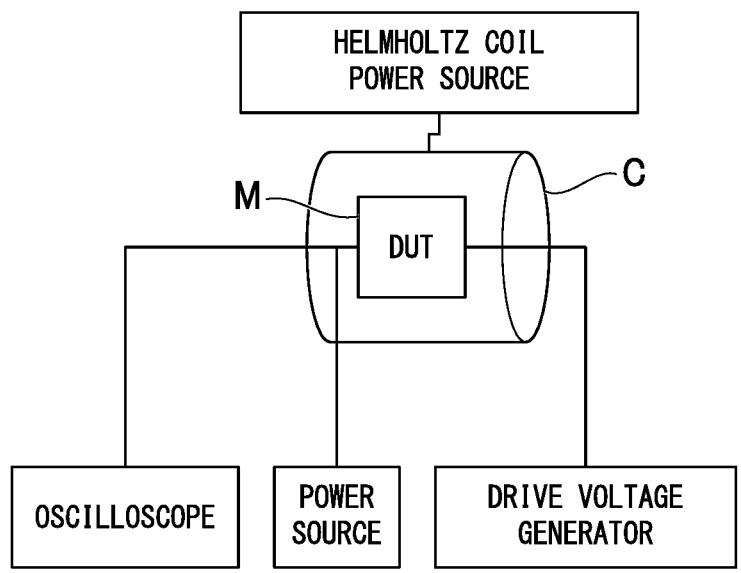
FIG. 20 is a schematic view showing an example of a method for applying an external magnetic field in Examples of the semiconductor integrated circuit and the magnetic detecting device related to the invention.
Figure 21:
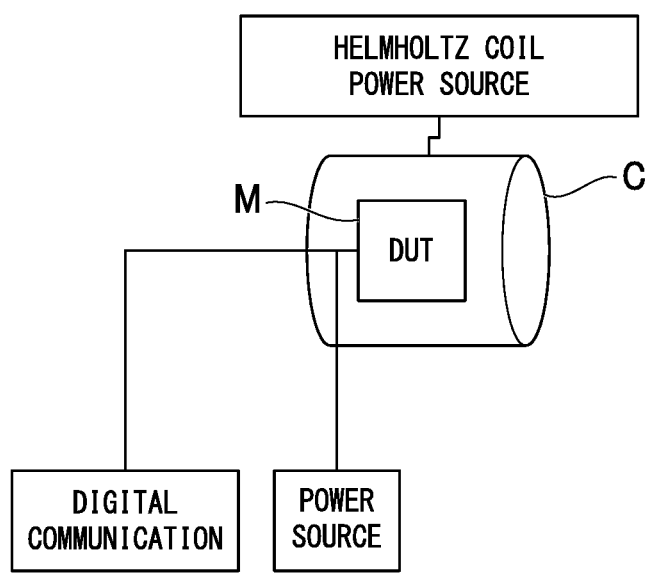
FIG. 21 is a schematic view showing an example of a method for applying an external magnetic field in Examples of the semiconductor integrated circuit and the magnetic detecting device related to the invention.

As shown in FIG. 20 or 21, a magnetic detecting device M which is the same as that of the third embodiment shown in FIG. 15 was disposed in a Helmholtz coil C.

In this state, an external magnetic field varying in the range of −2 to +2 mT was applied and the distance between the peaks of the spike-shaped voltage waveform was directly output.

Furthermore, the output was output as digital output serving as an intensity signal of the external magnetic field.

Regarding the configuration of the magnetic core of the magnetic sensor unit, the length A of the magnetic core in the longitudinal direction thereof was 480 μm, the width B of the end portion 101 was 80 μm, the width C of the center portion 102 was 20 μm, the length D of the end portion 101 in the longitudinal direction thereof was 140 μm, the number of windings of the excitation coil was 16.5, and the number of windings of the pick-up coil was 6.5.

An amplitude of vibration of the triangular wave current is 100 mA and the frequency thereof is 30 kHz.

FIG. 6 is a chart illustrating an external magnetic field dependency in the time interval t at which each of positive and negative pulsed pickup voltages exceeds the reference voltage Vth, that is, output of the magnetic detecting device M with respect to the external magnetic field.

FIG. 6B shows the interval between peaks (μm) of the magnetic detecting device M in the case where the stop signal, which is not output at the region close to the peak of the external magnetic field, is output from the clock-signal control circuit.

Furthermore, the corresponding digital output is shown in FIG. 7.

As a result, the digital output is the range of −0.9 mT to +1.9 mT which is an output range other than the peak point of the triangular waveform magnetic field due to the stop signal.

Consequently, the output range is converted into, for example, a digital output (LSB) of 14 bits as shown in FIG. 8.

Accordingly, the upper limit of the digital output is approximately 16384.

As a result, it is found that the full scale of the digital output can be used in a state where the linearity is maintained.

What is claimed is:

1. A semiconductor integrated circuit comprising:
a clock-signal generation circuit;
a signal processing circuit outputting an intensity signal corresponding to an intensity of an external magnetic field based on a time interval between a first spike-shaped voltage waveform and a second spike-shaped voltage waveform in accordance with a clock signal output from the clock-signal generation circuit, the second spike-shaped voltage waveform being detected subsequent to the first spike-shaped voltage waveform, the second spike-shaped voltage waveform having an inverse sign to that of the first spike voltage waveform; and a clock-signal control circuit controlling and outputting a stop signal allowing intensity-signal output, which is output from the signal processing circuit, to be stopped in at least a forward outage time and a backward outage time, the forward outage time being previous to an apex point of a triangular wave and having 1 to 5% of a triangular wave period, the backward outage time being subsequent to the apex point of the triangular wave and having 1 to 5% of a triangular wave period.

2. The semiconductor integrated circuit according to claim 1, wherein
the semiconductor integrated circuit is used for a flux-gate magnetic sensor having a magnetic core, an excitation unit varying magnetic flux of the magnetic core, and a detecting coil detecting the magnetic flux of the magnetic core, and
the magnetic sensor provides a triangular wave current to the excitation unit as an excitation current, detects the first spike-shaped voltage waveform having a positive sign output from the detecting coil and the second spike-shaped voltage waveform having a negative sign, measures the time interval between the first spike-shaped voltage waveform and the second spike-shaped voltage waveform, and detects an intensity of an external magnetic field based on the time interval.

3. The semiconductor integrated circuit according to claim 1, wherein
an intensity signal of an external magnetic field at time excluding the forward outage time and the backward stop is output as a dynamic range.

4. A magnetic detecting device comprising:
a flux-gate magnetic sensor unit comprising: a magnetic core; a detecting coil detecting variations in magnetic flux in the magnetic core; an excitation unit varying magnetic flux in the magnetic core in accordance with a periodic excitation current to be supplied; and a detection unit detecting induced output generated from the detecting coil in accordance with variations in magnetic flux in the magnetic core due to the excitation unit, the flux-gate magnetic sensor unit providing a triangular wave current to the excitation unit as an excitation current, the flux-gate magnetic sensor unit detecting spike-shaped voltage waveforms having a positive sign and a negative sign output from the detecting coil, the flux-gate magnetic sensor unit measuring a time interval between a first spike-shaped voltage waveform and a second spike-shaped voltage waveform, the second spike-shaped voltage waveform being detected subsequent to the first spike-shaped voltage waveform, the second spike-shaped voltage waveform having an inverse sign to that of the first spike voltage waveform, the flux-gate magnetic sensor unit detecting an intensity of an external magnetic field based on the time interval; and
a semiconductor integrated circuit comprising: a clock-signal generation circuit; a signal processing circuit outputting an intensity signal corresponding to an intensity of an external magnetic field based on a time interval between the induced outputs which are detected by the detection unit and which have signs different from each other in accordance with a clock signal output from the clock-signal generation circuit; and a clock-signal control circuit controlling and outputting a stop signal allowing intensity-signal output, which is output from the signal processing circuit, to be stopped in at least a forward outage time and a backward outage time, the forward outage time being previous to an apex point of a triangular wave and having 1 to 5% of a triangular wave period, the backward outage time being subsequent to the apex point of the triangular wave and having 1 to 5% of a triangular wave period.

5. The magnetic detecting device according to claim 4, wherein an intensity signal of an external magnetic field at time excluding the forward outage time and the backward stop is output as a dynamic range in the semiconductor integrated circuit.

6. An electronic compass comprising:

a substrate;

a first flux-gate magnetic sensor unit, a second flux-gate magnetic sensor unit, and a third flux-gate magnetic sensor unit disposed on the substrate and arranged along three axes; and a semiconductor integrated circuit, wherein each of a first magnetic sensor unit, a second magnetic sensor unit, and a third magnetic sensor unit comprises: a magnetic core; a detecting coil detecting variations in magnetic flux in the magnetic core; an excitation unit varying magnetic flux in the magnetic core in accordance with a periodic excitation current to be supplied; and a detection unit detecting induced output generated from the detecting coil in accordance with variations in magnetic flux in the magnetic core due to the excitation unit, each of the first magnetic sensor unit, the second magnetic sensor unit, and the third magnetic sensor unit provides a triangular wave current to the excitation unit as an excitation current, detects spike-shaped voltage waveforms having a positive sign and a negative sign output from the detecting coil, measures a time interval between a first spike-shaped voltage waveform and a second spike-shaped voltage waveform, detects an intensity of an external magnetic field based on the time interval, the second spike-shaped voltage waveform is detected subsequent to the first spike-shaped voltage waveform, the second spike-shaped voltage waveform has an inverse sign to that of the first spike voltage waveform, and the semiconductor integrated circuit comprises: a clock-signal generation circuit; a signal processing circuit outputting an intensity signal corresponding to an intensity of an external magnetic field based on a time interval between the induced outputs which are detected by the detection unit and which have signs different from each other in accordance with a clock signal output from the clock-signal generation circuit; and a clock-signal control circuit controlling and outputting a stop signal allowing intensity-signal output, which is output from the signal processing circuit, to be stopped in at least a forward outage time and a backward outage time, the forward outage time is previous to an apex point of a triangular wave and having 1 to 5% of a triangular wave period, the backward outage time is subsequent to the apex point of the triangular wave and having 1 to 5% of a triangular wave period.

7. The electronic compass according to claim 6, wherein an intensity signal of an external magnetic field at time excluding the forward outage time and the backward stop is output as a dynamic range in the semiconductor integrated circuit.

8. An ammeter comprising:

a substrate;

a first flux-gate magnetic sensor unit, a second flux-gate magnetic sensor unit, and a third flux-gate magnetic sensor unit disposed on the substrate and arranged along three axes; and a semiconductor integrated circuit, wherein each of a first magnetic sensor unit, a second magnetic sensor unit, and a third magnetic sensor unit comprises: a magnetic core; a detecting coil detecting variations in magnetic flux in the magnetic core; an excitation unit varying magnetic flux in the magnetic core in accordance with a periodic excitation current to be supplied; and a detection unit detecting induced output generated from the detecting coil in accordance with variations in magnetic flux in the magnetic core due to the excitation unit, each of the first magnetic sensor unit, the second magnetic sensor unit, and the third magnetic sensor unit provides a triangular wave current to the excitation unit as an excitation current, detects spike-shaped voltage waveforms having a positive sign and a negative sign output from the detecting coil, measures a time interval between a first spike-shaped voltage waveform and a second spike-shaped voltage waveform, detects an intensity of an external magnetic field based on the time interval, the second spike-shaped voltage waveform is detected subsequent to the first spike-shaped voltage waveform, the second spike-shaped voltage waveform has an inverse sign to that of the first spike voltage waveform, and the semiconductor integrated circuit comprises: a clock-signal generation circuit; a signal processing circuit outputting an intensity signal corresponding to an intensity of an external magnetic field based on a time interval between the induced outputs which are detected by the detection unit and which have signs different from each other in accordance with a clock signal output from the clock-signal generation circuit; and a clock-signal control circuit controlling and outputting a stop signal allowing intensity-signal output, which is output from the signal processing circuit, to be stopped in at least a forward outage time and a backward outage time, the forward outage time is previous to an apex point of a triangular wave and having 1 to 5% of a triangular wave period, the backward outage time is subsequent to the apex point of the triangular wave and having 1 to 5% of a triangular wave period.

9. The ammeter according to claim 8, wherein an intensity signal of an external magnetic field at time excluding the forward outage time and the backward stop is output as a dynamic range in the semiconductor integrated circuit.

* * * * *